United States Patent
Degner et al.

(10) Patent No.: US 9,069,535 B2
(45) Date of Patent: *Jun. 30, 2015

(54) COMPUTER THERMAL SYSTEM

(71) Applicant: Apple Inc., Cupertino, CA (US)

(72) Inventors: Brett W. Degner, Menlo Park, CA (US); Eric R. Prather, Santa Clara, CA (US); David H. Narajowski, Los Gatos, CA (US); Frank F. Liang, San Jose, CA (US); Jay S. Nigen, Mountain View, CA (US); Jesse T. Dybenko, Santa Cruz, CA (US); Connor R. Duke, Sunnyvale, CA (US); Eugene A. Whang, San Francisco, CA (US); Christopher J. Stringer, Woodside, CA (US); Joshua D. Banko, Palo Alto, CA (US); Caitlin Elizabeth Kalinowski, San Francisco, CA (US); Jonathan L. Berk, Mountain View, CA (US); Matthew P. Casebolt, Fremont, CA (US); Kevin S. Fetterman, Los Altos, CA (US); Eric J. Weirshauser, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/297,576

(22) Filed: Jun. 5, 2014

(65) Prior Publication Data

US 2014/0362522 A1 Dec. 11, 2014

Related U.S. Application Data

(60) Provisional application No. 61/832,698, filed on Jun. 7, 2013, provisional application No. 61/832,709, filed on Jun. 7, 2013, provisional application No. 61/832,695, filed on Jun. 7, 2013, provisional application No. 61/832,633, filed on Jun. 7, 2013.

(51) Int. Cl.
  *G06F 1/20* (2006.01)
  *G08B 5/36* (2006.01)
  (Continued)

(52) U.S. Cl.
  CPC ............. *G06F 1/20* (2013.01); *H05K 7/20145* (2013.01); *H05K 7/20163* (2013.01);
  (Continued)

(58) Field of Classification Search
  CPC . H05K 7/20136–7/20172; G06F 1/181–1/183; G06F 1/20; G06F 2200/201
  USPC ........................ 361/679.46–679.54, 688–723; 165/80.3, 185; 174/547–548, 16.1, 174/16.3; 454/184
  See application file for complete search history.

(56) References Cited

U.S. PATENT DOCUMENTS 3,596,139 A * 7/1971 Walsh ........................... 174/562
5,424,915 A * 6/1995 Katooka et al. ............... 361/695

(Continued)

FOREIGN PATENT DOCUMENTS

| CN | 201926963 | 8/2011 |
| CN | 202486681 | 10/2012 |

(Continued)

OTHER PUBLICATIONS

PCT Application No. PCT/US2014/041165—International Search Report and Written Opinion dated Sep. 29, 2014.
(Continued)

*Primary Examiner* — Zachary M Pape
(74) *Attorney, Agent, or Firm* — Downey Brand LLP

(57) ABSTRACT

The present application describes various embodiments regarding systems and methods for providing efficient heat rejection for a lightweight and durable compact computing system having a small form factor. The compact computing system can take the form of a desktop computer. The desktop computer can include a monolithic top case having an integrated support system formed therein, the integrated support system providing structural support that distributes applied loads through the top case preventing warping and bowing. A mixed flow fan is utilized to efficiently pull cooling air through the compact computing system.

33 Claims, 23 Drawing Sheets

(51) Int. Cl.
*G08B 21/18* (2006.01)
*H05K 5/03* (2006.01)
*F21V 8/00* (2006.01)
*G06F 3/00* (2006.01)
*H05K 7/20* (2006.01)
*G06F 1/18* (2006.01)

(52) U.S. Cl.
CPC .......... *H05K 7/20172* (2013.01); *G06F 1/182* (2013.01); *G06F 1/183* (2013.01); *G06F 1/185* (2013.01); *G06F 1/188* (2013.01); *G08B 5/36* (2013.01); *G08B 21/18* (2013.01); *H05K 5/03* (2013.01); *G02B 6/0001* (2013.01); *G06F 1/181* (2013.01); *G06F 3/00* (2013.01)

(56) References Cited

U.S. PATENT DOCUMENTS

| | | | |
|---|---|---|---|
| 5,912,802 | A | 6/1999 | Nelson |
| 6,373,697 | B1 | 4/2002 | Lajara et al. |
| 6,459,577 | B1 * | 10/2002 | Holmes et al. ............. 361/690 |
| 7,367,384 | B2 | 5/2008 | Madara et al. |
| 7,492,590 | B2 | 2/2009 | Chen et al. |
| 7,679,908 | B2 * | 3/2010 | Yeh et al. ............. 361/695 |
| 7,742,298 | B2 * | 6/2010 | Kunz ............. 361/690 |
| 8,279,597 | B2 * | 10/2012 | El-Essawy et al. ...... 361/679.49 |
| 8,576,565 | B2 * | 11/2013 | Matsumoto et al. ......... 361/697 |
| 2002/0170905 | A1 | 11/2002 | Peterson et al. |
| 2004/0095719 | A1 | 5/2004 | Rong-Yao |
| 2005/0286226 | A1 * | 12/2005 | Ishii et al. ............. 361/697 |
| 2007/0177349 | A1 * | 8/2007 | Pokharna et al. ............ 361/696 |
| 2008/0019092 | A1 | 1/2008 | Chen et al. |
| 2009/0059516 | A1 | 3/2009 | Lai et al. |
| 2010/0002383 | A1 | 1/2010 | Yeh et al. |
| 2010/0172084 | A1 | 7/2010 | Winokur |
| 2011/0022770 | A1 | 1/2011 | Sullivan |
| 2011/0093729 | A1 | 4/2011 | Mucignat et al. |
| 2011/0102991 | A1 | 5/2011 | Sullivan |
| 2011/0122566 | A1 | 5/2011 | Hsieh et al. |
| 2011/0122576 | A1 | 5/2011 | Kuo et al. |
| 2011/0299239 | A1 | 12/2011 | Santos |
| 2012/0106064 | A1 | 5/2012 | Li et al. |
| 2012/0211211 | A1 | 8/2012 | Shih |
| 2013/0083478 | A1 | 4/2013 | Lin |
| 2013/0088829 | A1 | 4/2013 | Co |

FOREIGN PATENT DOCUMENTS

| | | |
|---|---|---|
| EP | 1065752 | 1/2001 |
| EP | 1478020 A1 | 11/2004 |
| WO | WO 2011130944 A1 * | 10/2011 |

OTHER PUBLICATIONS

PCT Application No. PCT/US2014/041160—International Search Report and Written Opinion dated Oct. 1, 2014.
PCT Application No. PCT/US2014/041153—International Search Report and Written Opinion dated Oct. 15, 2014.
Chinese Patent for Utility Model No. ZL201420297132.0—Evaluation Report for Utility Model Patent dated Dec. 3, 2014.
FIC Piston Won Best Choice of COMPUTEX Taipei 2005, First International Computers, Inc., http://www.fic.com.tw/press.aspx?pr_id=146, May 2005.
Dell Precision Workstation M6500 Service Manual, ftp://ftp.dell.com/Manuals/all-products/esuprt_laptop/esuprt_precision_mobile/precision-m6500_service%20manual_en-us.pdf, Mar. 2010.
Shrout, "BFG Technologies GeForce 7900 GT OC Review," BFG Tech, http://www.pcper.com/reviews/Graphics-Cards/BFG-Technologies-GeForce-7900-GT-0C-Review/Card-and-Features, May 2006.
Seguin. "Computer Shaped Like a Tube: a Nettop by CLVE." Tomsguide.com. http://www.tomsguide.com/us/CLVE-TVBE-Nettop.news-2860.html. Oct. 2008.

* cited by examiner

COMPUTER THERMAL SYSTEM

CROSS REFERENCE TO RELATED APPLICATIONS

This application claims the benefit of priority under 35 U.S.C §119(e) to:

(i) U.S. Provisional Application No. 61/832,698 filed on Jun. 7, 2013 and entitled "COMPUTER ARCHITECTURE RESULTING IN IMPROVED COMPONENT DENSITY AND THERMAL CHARACTERISTICS";

(ii) U.S. Provisional Application No. 61/832,709 filed on Jun. 7, 2013 and entitled "INTERNAL COMPONENT AND EXTERNAL INTERFACE ARRANGEMENT FOR A COMPACT COMPUTING DEVICE";

(iii) U.S. Provisional Application No. 61/832,695 filed Jun. 7, 2013 and entitled "ENCLOSURE/HOUSING FEATURES OF A COMPUTER FOR IMPROVED THERMAL PERFORMANCE AND USER EXPERIENCE"; and (iv) U.S. Provisional Application No. 61/832,633 filed Jun. 7, 2013, entitled "THERMAL PERFORMANCE OF A COMPACT COMPUTING DEVICE", each of which is incorporated herein by reference in its entirety for all purposes.

This application is related to:

(i) International Patent Application No. PCT/US2014/041165 filed Jun. 5, 2014 and entitled "COMPUTER SYSTEM";

(ii) International Patent Application No. PCT/US2014/041160 filed Jun. 5, 2014 and entitled "COMPUTER THERMAL SYSTEM"; and (iii) PCT International Patent Application No. PCT/US2014/041153, filed Jun. 5, 2014, entitled "COMPUTER INTERNAL ARCHITECTURE", each of which is incorporated herein by reference in its entirety for all purposes.

TECHNICAL FIELD

The embodiments described herein relate generally to compact computing systems. More particularly, the present embodiments relate to mechanical and thermal structures that contribute to increased thermal efficiency of a compact computing system.

BACKGROUND

The outward appearance of a compact computing system, including its design and its heft, is important to a user of the compact computing system, as the outward appearance contributes to the overall impression that the user has of the compact computing system. At the same time, the assembly of the compact computing system is also important to the user, as a durable assembly will help extend the overall life of the compact computing system and will increase its value to the user.

One design challenge associated with the manufacture of compact computing systems is the rejection of heat from the compact computing system. This design challenge generally arises from a number of conflicting design goals that include the desirability of making the outer enclosure or housing lighter and thinner, of making the enclosure stronger, and of making the enclosure aesthetically pleasing, among other possible goals. Unfortunately, small form-factor housings or enclosures tend to have less surface area across which heat can be dissipated through convection or radiation. Furthermore, even though smaller form-factor housings are desired, decreases in performance are generally deemed unacceptable.

SUMMARY

The present application describes various embodiments regarding systems and methods for dissipating heat from a lightweight and durable compact computing system having a cylindrical cross section.

A compact computing system includes a housing having a longitudinal axis and that encloses and defines an internal volume that is symmetric about the longitudinal axis, a heat sink that encloses at least a central thermal zone having a cross section having a shape of a polygon and that is substantially perpendicular to the longitudinal axis, an air mover configured to direct air through the internal volume and comprising a central airflow through the central thermal zone, and a computing component disposed within the internal volume and supported by and in thermal contact with the heat sink.

A desktop computing system includes a housing that at least partially encloses and defines an internal volume that is symmetric about an axis, an air passage within the internal volume that extends along an entire length of the housing, and a computing engine disposed within the air passage and comprising at least one computing component.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatuses and methods for providing compact computing systems. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements.

DETAILED DESCRIPTION

Figure 1:
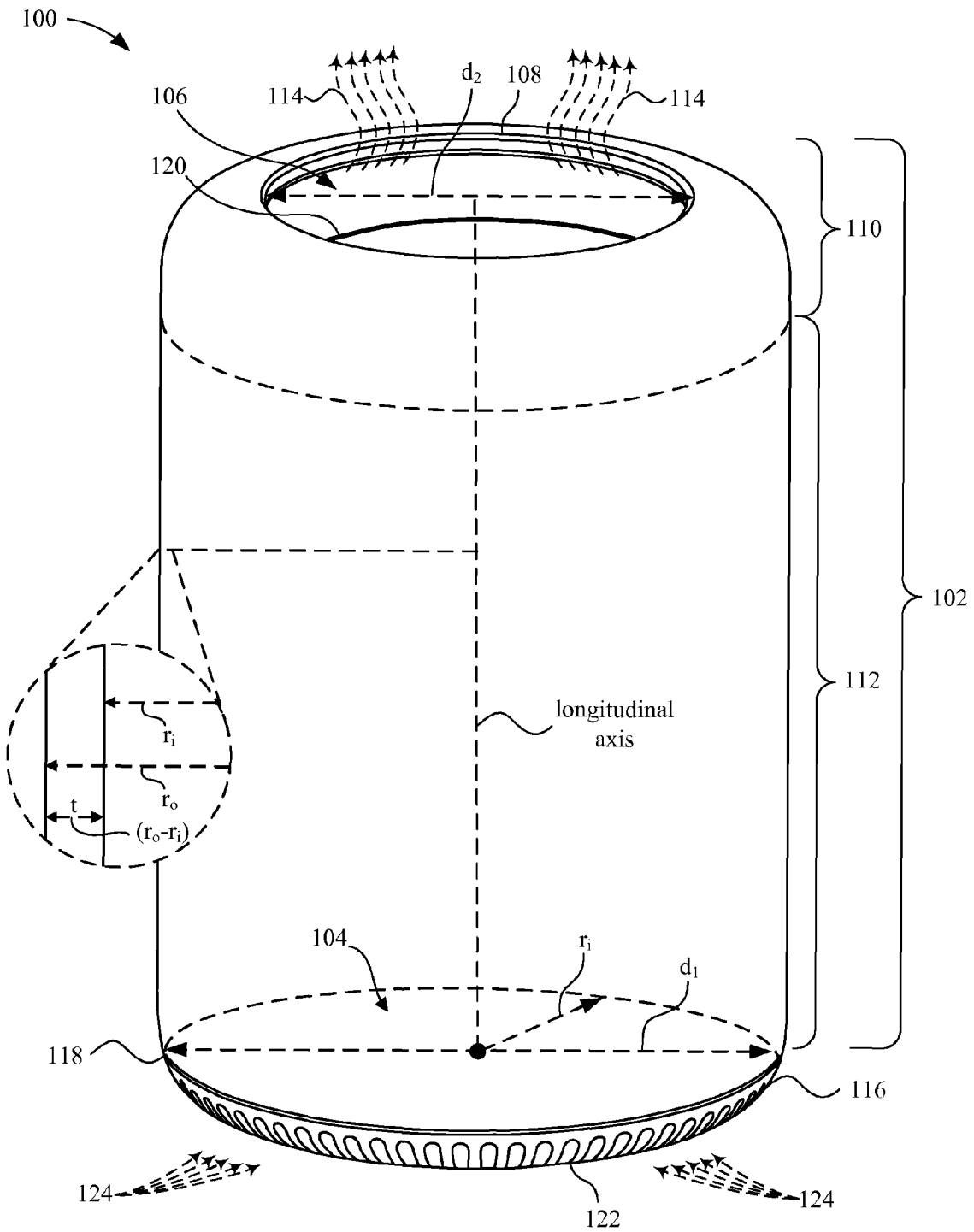
FIG. 1 shows a perspective view of an embodiment of the compact computing system in a stand-alone and upright configuration.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The following relates to a compact computing system that can be configured as a stand-alone unit for placement upon or under a desk or other work area (also referred to as a desktop computer). The compact computing system can also be configured as part of a group of networked or otherwise interconnected computers. In any case, the compact computing system can include a number of electronic components including at least a central processing unit (CPU), and a graphics processing unit (GPU), and other primary and secondary components such a solid state memory devices, wireless components and so on. One or more internal electronic component boards can be shaped to match a surface of the outer enclosure of the compact computing system, including for example, a circular shape to match a top or bottom of a cylinder, or a curved shape to match a segment of an arc conforming to a curved exterior surface of the outer enclosure. In representative embodiments as described herein, the compact computing system can be cylindrical in shape and can be configured to arrange a number of rectangular electronic components as a central core providing a form factor characterized as having a high component packing density (a number of components per available volume). The resulting compact computing device can provide a high computing power density in a small, lightweight, transportable form factor. In some embodiments, the compact computing device can also be coupled to other compact computing devices to form a multi-computer system that can be used as a server computer system (such as in a data farm) or as a network computing system having each compact computing device as a node (or nodes). For example, in the embodiments described herein, the compact computing system can be cylindrical and be configured in such a way that the rectangular electronic components can be assembled as a central core with a form factor having a high component packing density (number of components per available volume). The central core can also have a cylindrical shape in concurrence with a housing having an annular cylindrical shape along the lines of a tube. A thermal management system can respond to changes in an activity level of the central core and can utilize an air mover that can be move copious amounts of air axially through an interior volume defined by the cylindrical housing that can be used to cool the central core in a manner that is both efficient and quiet. Generally speaking, the air mover can provide an airflow of about 15-20 cubic feet per minute (CFM) when major components such as a central processing unit (CPU) and/or a graphics processing unit (GPU) are not being heavily utilized. However, when processing demand increases, the air mover can compensate for any increase in heat generated by ramping up the airflow. For example, in response to an increase in demand for processing resources from either or both the CPU and/or GPU, the air mover can increase the airflow from about 15-20 CFM to about 25-30 CFM (at about room temperature of 25° C.) with an acoustic output of about 35 dbA (it should be noted that these acoustic levels are only experienced when the air mover is performing at a higher end of its operating range during a period of high demand and not during more normal operation). It should be noted that at higher ambient temperature (35° C.), the air mover can ramp the airflow even further to compensate for the reduced thermal transfer at the higher ambient temperature. In this situation, the air mover can ramp the airflow to about 35 to 40 CFM or more having a higher acoustic output of 40 dbA or more.

The air mover can occupy a substantial amount of available cross sectional defined by the housing providing an axial airflow substantially free of radial airflow components through a central portion of the housing that includes a central core that includes a heat sink. Moreover, components that make up the central core can be aligned in an axial manner that maximizes an amount of surface area in thermal contact with the axial airflow. Furthermore, the design and layout of the components can also be axial in nature further enhancing the available heat transfer capability and component packing density that leads to higher computing power density (computing operations per available volume). For example, an integrated circuit can be designed to have a power input node (s) at a first end of the integrated circuit and data I/Os at an opposite end of the integrated circuit.

The compact computing system can also be coupled to other compact computing systems to form a multi-computer system that can be used as a server computer system (such as in a data farm) or as a network computing system having each compact computing system as a node (or nodes). One advantage of the compact size and shape of the compact computing system is that a simple racking system (along the lines of a wine rack configuration) can be used to position the multiple connected compact computing systems. For example, the individual compact computing systems can be placed at an angle within a rack arrangement in such a way as to provide easy access to inputs as well as outputs for connection to other devices without restricting the flow of air into or out of the compact computing system. In some cases, the individual compact computing systems can be stacked in an alternating arrangement that also does not restrict either air intake or air exhaust. These and other general subjects are set forth in greater detail below.

In a particular embodiment, the compact computing system can include a housing that can surround and protect the central core. The housing can be easily removed for servicing or other access. The housing can be formed of aluminum having an aluminum oxide (alumina) layer that both protects the housing and promotes radiative cooling. The aluminum oxide/anodization layer also improved heat rejection from external surface of the housing by increasing its infrared radiative emissivity. Aluminum has a number of characteristics that make it a good choice for the housing. For example, aluminum is a good electrical conductor that can provide good electrical ground and it can be easily machined and has well known metallurgical characteristics. The superior conductivity of aluminum provides a good chassis ground for internal electrical components arranged to fit and operate within the housing. The aluminum housing also provides a good electromagnetic interference (EMI) shield protecting sensitive electronic components from external electromagnetic energy as well as reducing leakage of electromagnetic (EM) energy from the compact computing system. A layer of aluminum oxide can be formed on the surface of the aluminum in a process referred to as anodization. In some cases, the layer of aluminum oxide can be dyed or otherwise imbued with a color(s) to take on a specific color or colors. It should be noted that since aluminum oxide is a good electrical insulator, either the interior surface of the housing is masked during the anodization process to preserve access to the bulk material or selected portions of the layer of aluminum oxide are removed to provide good electrical contacts.

In one embodiment, the cylindrical housing can take the form of a single piece housing (monolithic). In this way, the cylindrical housing appears seamless and homogenous. In two dimensions (2D), the cylindrical shape of the housing maximizes a ratio of the volume and enclosure surface area. However, in three dimensions a spherical shape maximizes a ratio of the internal volume and enclosure surface area. In the context of this discussion, the cylinder can be considered more useful; however, a sphere or any other shape for that matter can nonetheless be considered a suitable alternative. In one embodiment, the cylindrical housing is formed of a single billet of a strong and resilient material such as aluminum that is surface treated (anodized) to provide an aesthetically pleasing appearance. A top portion of the cylindrical housing is formed into the lip used to engage a circumferential portion of the airflow that travels in an axial direction from the first opening to the second opening at which point the airflow passes to an external environment. The lip can also be used to transport the compact computing system using for example, a hand.

In a particular embodiment, a compact computing system can be assembled using a bottom up type assembly. Initial assembly operations can include installing a vapor chamber on each side of a triangular central core structure. In the described embodiments, the vapor chamber can take on the form of a two phase (vapor/solid) heat spreader. In a particular implementation, the core can take the form of an aluminum frame secured to and cradled within a fixture. High power components, such as a graphic processor unit (GPU) and/or central processor unit (CPU) can be mounted directly to the vapor chambers.

A good thermal contact can be formed between the vapor chambers and the high power components using a thermally conductive adhesive, paste, or other suitable mechanism. A main logic board (MLB) can be pressed against a CPU edge connector followed by installation of a GPU flex(es). Once the MLB is seated and connected to the CPU and GPU, memory modules can be installed after which an inlet assembly can be installed and coupled to the core structure using fasteners. An input/output (I/O) assembly that has been independently assembled and pre-tested can be installed after which a power supply unit (PSU) control cable can be connected to the MLB followed by connecting the DC PSU power using a bus bar system. An exhaust assembly can be installed followed by connecting a RF antenna flexes to an I/O board.

As noted above, the housing can take on many forms, however, for the remainder of this discussion and without loss of generality, the housing takes on a cylindrical shape that encloses and defines a cylindrical volume. In the described embodiment, the housing and the corresponding cylindrical volume can be defined in terms of a right circular cylinder having a longitudinal axis that can be used to define a height of the right circular cylinder. The housing also can be characterized as having a circular cross section having a center point on the longitudinal axis. The circular cross section can have a radius that extends from the center point and is perpendicular to the longitudinal axis. In one embodiment, a thickness of the housing can be defined in terms of a relationship between an inner radius (extending from the center point to an interior surface of the housing) and an outer radius (extending from the center point to an exterior surface of the housing). The housing can have a thickness tuned to promote circumferential and axial conduction that aids in the spreading out of heat in the housing thereby inhibiting formation of hot spots. The separation between the central core and the housing allows an internal peripheral airflow to cool the housing helping to minimize a touch temperature of the housing. In one embodiment, the housing can be mated to a (releasable) base unit that provides, in part, a pedestal used to support the compact computing system on a surface. The housing can include a first opening having a size and shape in accordance with the base unit. The first opening can be a full perimeter air inlet whose circular design allows for functionality even in those situations where the compact computing system is located in a corner or against a wall. In an assembled configuration, the base unit corresponds to a base of the cylinder. The first opening can be used to accept a flow of air from an external environment passing through vents in the base unit. The amount of air that flows into the housing is related to a pressure differential between the external environment and an interior of the compact computing system created by an air mover assembly near a second opening axially disposed from the first opening. A thermal management system can utilize the air mover that can be move copious amounts of air axially through an interior volume defined by the cylindrical housing that can be used to cool the central core in a manner that is both efficient and quiet.

In one embodiment, an air exhaust assembly can take the form of a fan assembly. The fan assembly can be an axial fan assembly configured to axially move air through the housing by creating the abovementioned pressure differential. The fan assembly can also be configured as a mixed air fan assembly providing both axial and centrifugal components to air as it exits the fan assembly. In one embodiment, the fan assembly can occupy a substantial portion of available cross sectional area of the cylindrical housing. For example, the fan assembly can account for at least 85% or thereabouts of an available cross sectional area of an interior of the housing. In any case, air can enter through the vents in the base unit. In one embodiment, a baffle arrangement can bifurcate (split) the airflow in such a way that some of the airflow remains within a central column separate from a peripheral airflow located away from the central column. The central column of air can thermally engage a heat sink structure on which internal components can be mounted. In order to optimize thermal transfer, components can be configured and mounted axially (in the direction of airflow) in order to maximize an amount of air engaging the components. In this way, both the central airflow and the peripheral airflow can be used to cool the central core and still maintain the housing at an acceptable temperature.

The housing can include an exhaust lip at the second opening. The exhaust lip can be arranged to engage a portion of the air as it flows out of the second opening having the effect of directing the airflow (and sound) away from the user. The exhaust lip can also provide an integrated handle structure suitable for grasping the compact computing system. The housing can have a thickness that is tuned by which it is meant that the housing has a varying thickness in which a portion of the housing nearest the exhaust lip is thicker than that portion away from the exhaust lip. The thickness of the housing can be varied in a manner that promotes an axial and circumferential conduction of heat in the housing that promotes a more even distribution of heat that inhibits the formation of hot spots in the housing.

A good electrical ground (also referred to as a chassis ground) can be used to isolate components that emit significant electromagnetic energy (such as a main logic board, or MLB) from those circuits, such as wireless circuits, that are sensitive to electromagnetic energy. This isolation can be particularly important in the compact computing system due to the close proximity of components that emit electromagnetic energy and those components that are sensitive to electromagnetic energy. Moreover, the housing can include conductive material (such as a gasket infused with conductive particles) that can be mated to a corresponding attachment feature on the base unit completing the formation of a Faraday cage. The Faraday cage can block electromagnetic energy (both internal and external) effectively shielding the external environment from EMI generated by the compact computing system (and the internal environment from externally generated EMI). In order to complete the Faraday cage, air vents in the base unit can be sized to effectively block electromagnetic energy having selected wavelength. More specifically, the wavelength of electromagnetic energy blocked by the vents can be consistent with that emitted by active components with the compact computing system.

In one embodiment, the compact computing system can include a sensor configured to detect whether or not the housing is properly in place and aligned with respect to the internal components. Proper placement of the housing is important due to the key role that both the shape and configuration of the housing has with respect to thermal management of the compact computing system as well as completing the Faraday cage discussed above. The compact computing system can include an interlock system that detects the presence and proper alignment of the housing with respect to the internal components. Only when the proper alignment is detected, the interlock system will allow the internal components to power up and operate in a manner consistent with system specification. In one embodiment, the interlock system can include a magnetic element detectable by a Hall effect sensor only when the housing is in a proper position and alignment with respect to the internal components.

Due at least to the strong and resilient nature of the material used to form the housing; the housing can include a large opening having a span that does not require additional support structures. Such an opening can be used to provide access to an input/output panel and power supply port. The input/output panel can include, for example, data ports suitable for accommodating data cables configured for connecting external circuits. The opening can also provide access to an audio circuit, video display circuit, power input, etc. In one embodiment, selected data ports can be illuminated to provide easier access in reduced lighting.

These and other embodiments are discussed below with reference to FIGS. 1-15. However, those skilled in the art will readily appreciate that the detailed description given herein with respect to these figures is for explanatory purposes as the invention extends beyond these limited embodiments.

FIG. 1 shows a perspective view of compact computing system 100. Compact computing system 100 can have a shape defined by housing 102. In the described embodiments, housing 102 can be cylindrical in shape having a first opening 104 characterized as having diameter $d_1$. More specifically, housing 102 can take the form of a circular right cylinder having a longitudinal axis that extends long a centerline of a central volume enclosed by housing 102. Housing 102 can be characterized as having a circular cross section having a center point coincident with a corresponding point on the longitudinal axis. The circular cross section has a radius that is perpendicular to the longitudinal axis and extends outwardly therefrom. Accordingly, thickness t of housing 102 (more specifically a housing wall) can be defined as a difference between an outer radius $r_o$ associated with an exterior of housing 102 and inner radius $r_i$ associated with an interior surface of housing 102. Moreover, housing 102 can include second opening 106 axially disposed from first opening 104 having diameter $d_2$ defined in part by exhaust lip 108 where $d_1$ is at least equal to or greater than $d_2$. Housing 102 can be formed from a single billet of aluminum in the form of a disk that can be extruded in a manner forming exhaust lip 108. Thickness t of housing 102 can be tuned to mitigate hot spots. In this regard, housing 102 can have a non-uniform thickness t. In particular, portion 110 near exhaust lip 108 can have a first thickness of about 4-6 mm that then changes to a second thickness associated with portion 112 that is reduced from the first thickness and located away from exhaust lip 108. In this way, portion 110 can act as both an integrated handle used to grasp compact computing system 100 and as a feature that absorbs and conducts thermal energy transferred from a portion of exhaust airflow 114 that engages exhaust lip 108. Through radiative and conductive heat transfer and by limiting the amount of heat transferred to portion 112, the formation of local hot spots in housing 102 can be mitigated. Tuning the thickness of housing 102 can be accomplished using, for example, an impact extrusion process using a metal disk that is then machined to the desired thickness profile. The metal disk may be made of aluminum, titanium, and any other metallic material that provides the strength, thermal conductivity, and RF-isolation desired. The extrusion process forms a cylinder that is machined in the exterior portion and in the interior portion to acquire the desired cross sectional profile and also the desired visual appeal from the exterior.

Compact computing system 100 can further include base unit 116. Base unit 116 can be used to provide support for compact computing system 100. Accordingly, base unit 116 can be formed of strong and resilient material along the lines of metal that can also prevent leakage of electromagnetic (EM) energy from components within compact computing system 100 that radiate EM energy during operation. Base unit 116 can also be formed of non-metallic compounds that can nonetheless be rendered electrically conductive using, for example, electrically conductive particles embedded therein. In order to assure that any electromagnetic energy emitted by components within compact computing system 100 does not leak out, lower conductive gasket 118 can be used to complete a Faraday cage formed by base unit 116 and housing 102. Upper conductive gasket 120 (shown in more detail in FIG. 3) can be disposed on the interior surface of housing 102 near a lower edge of portion 110. Use of conductive gaskets 118 and 120 to complete the Faraday cage can increase EMI isolation by about 20 dB.

Base unit 116 can also include vents 122. Vents 122 can be dual purpose in that vents 122 can be arranged in base unit 116 in such a way that a suitable amount of air from an external environment can flow through vents 122 in the form of intake airflow 124. In one embodiment, intake airflow 124 can be related to a pressure differential across vents 122 created by an air mover disposed with compact computing system 100. In one embodiment, the air mover can be disposed near second opening 106 creating a suction effect that reduces an ambient pressure within housing 102. In addition to facilitating intake airflow 124, vents 122 can be sized to prevent leakage of electromagnetic energy there through. The size of vents 122 can be related to a wavelength corresponding to electromagnetic energy emitted by internal components.

Figure 2:
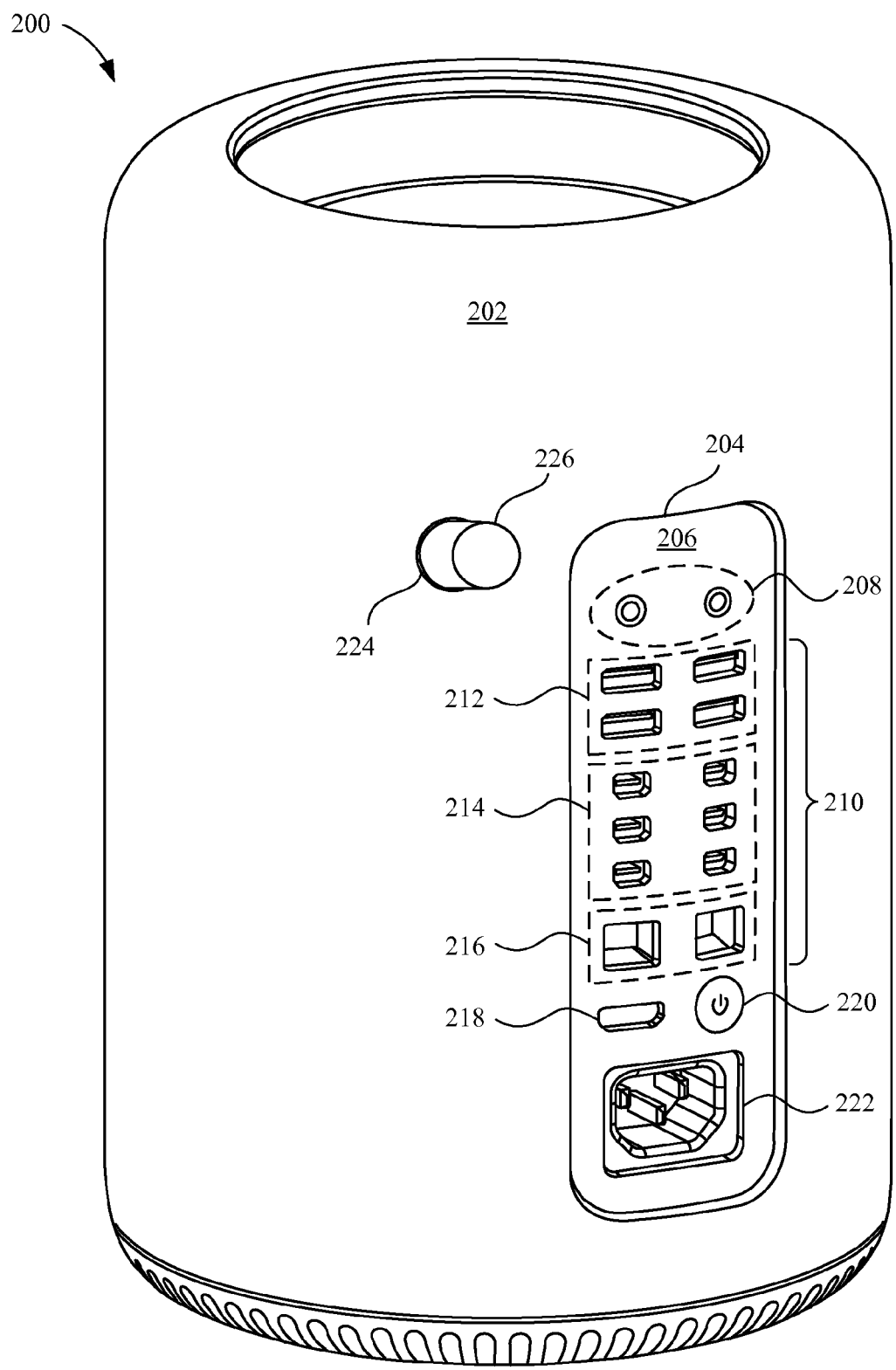
FIG. 2 shows another perspective view of an embodiment of the compact computing system of FIG. 1 showing an input/output panel.

FIG. 2 shows another embodiment of compact computing system 100 in the form of compact computing system 200. It should be noted that compact computing system 200 can be substantially the same or similar as compact computing system 100 with respect to size and shape of housing 102. Compact computing system 200 can include housing 202 that can differ from housing 102. In this embodiment, housing 202 can include opening 204 having a size and shape in accordance with interface panel 206. Interface panel 206 can include various ports used for communication of data between compact computing system 200 and various external circuits. For example, interface panel 206 can include audio jack ports 208 that can be used to provide an audio stream to an external audio circuit, such as a headphone circuit, audio processor, and the like. A set of data ports 210 can be used to transfer data of various forms and/or power between an external circuit(s) and compact computing system 200. Data ports 210 can be used to accommodate data connections such as USB, Thunderbolt®, and so on. For example, the set of data ports 210 can include data ports 212 in the form of USB ports whereas data ports 214 can take the form of Thunderbolt® ports. In this way, compact computing system 200 can be interconnected to other computing systems such as data storage devices, portable media players, and video equipment, as well as to form a network of computing systems. Furthermore, data ports 216 can take the form of Ethernet ports suitable for forming communication channels to other computing systems and external circuits whereas data port 218 in the form of an HDMI port can be used for audio/video (AV) data transport. In this way, data port 218 can be used to stream high speed video between compact computing system 200 and an external video monitor or other video processing circuitry. Accordingly, interface panel 206 can be used to form connections to a large number and variety of external computing systems and circuits which is particularly useful in those situations where a large amount of computing resources are required without the high capital costs associated with large mainframe type computers. Moreover, the compact size and shape of compact computing system 200 also lends itself to space efficient computing networks, data farms, and the like.

Interface panel 206 can be made of a non-conductive material to electrically insulate each of the ports from one another and from housing 202. Accordingly, interface panel 206 may include a plastic inlay dyed to provide a cosmetic appeal to computing system 200. For example, in some embodiments interface panel 206 is dyed with a black or dark tint. Below the surface of interface panel 206, a conductive web supported by a conductive gasket maintains a Faraday cage for RF and EMI insulation formed between housing 202 and upper and lower conductive gaskets (118, 120) located at an interior surface of housing 202. Power on/off button 220 can be readily available to accept a user touch for initiating a power on sequence (including, for example, boot up process) as well as a power down sequence. Power input port 222 can be sized and shaped to accept a power plug suitable for transferring external power to operational components within housing 202. In some cases, compact computing system 200 can include internal power resources (such as a battery) that can be charged and re-charged in accordance with power delivered by way of power input port 222.

Housing interlock opening 224 can be accommodate housing interlock 226 used to secure housing 202 to internal structures of compact computing system 200. Housing interlock 226 can take the form of a sliding latch or other such mechanism that can be manually engaged and disengaged. In this way, housing 202 can be easily removed in order to expose internal components and structures for servicing, for example. It should be noted that although not shown, a detection circuit can be used to detect if housing 202 is properly in place with respect to internal components and structures. This is particularly important since thermal management of compact computing system 200 relies to a large degree on the presence and proper placement of housing 202. Therefore, it is desired that if it is determined that housing 202 is not in proper placement or alignment with respect to internal structures or components, then the detection circuit will prevent compact computing system 200 from operating, or at least operating at full capacity. In one embodiment, the detection circuit can include a magnetic sensor (such as a Hall Effect device) located to detect a magnet(s) disposed on housing 202 only when housing 202 is properly placed and aligned.

Figure 3:
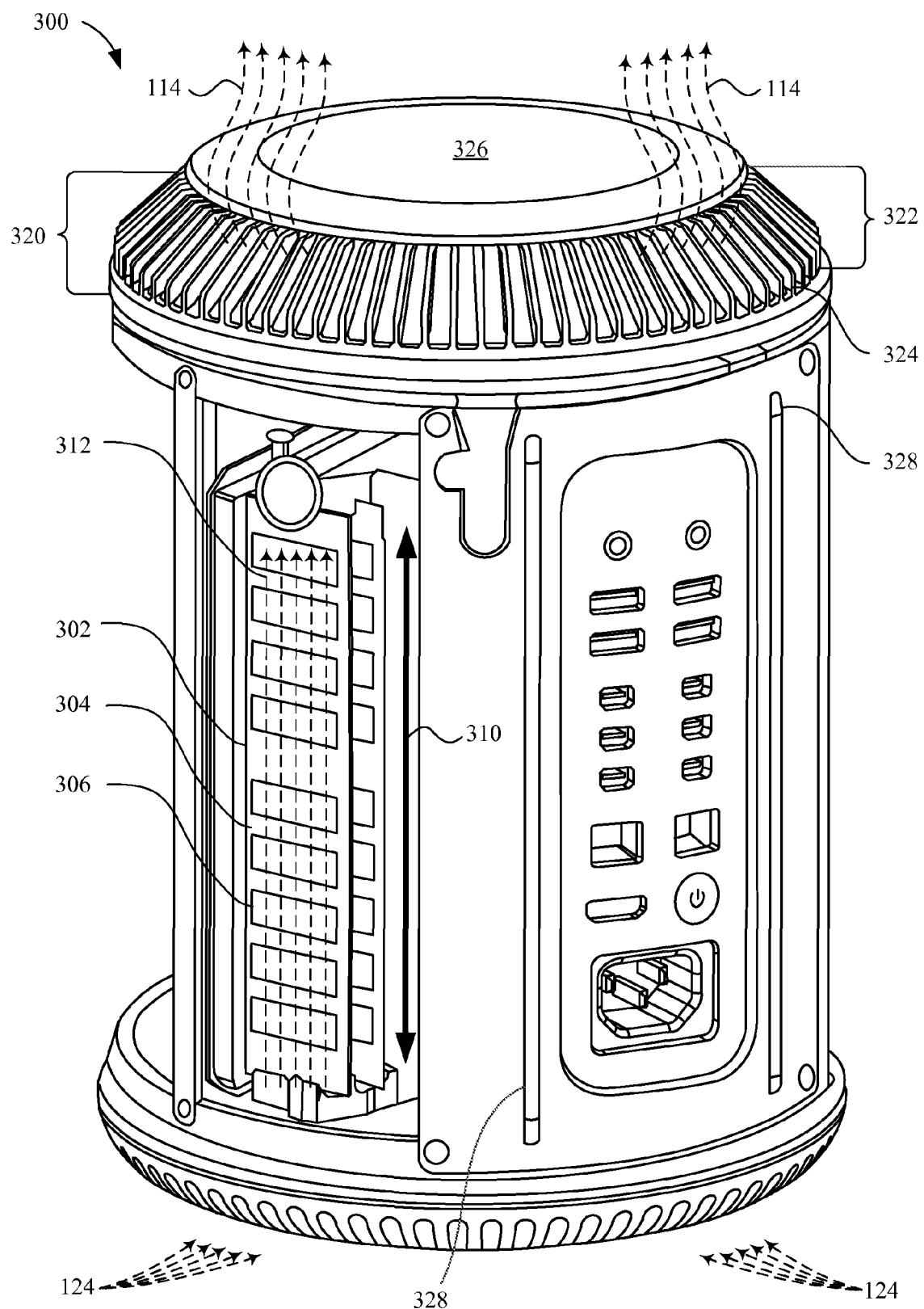
FIG. 3 shows a perspective view of a general system layout of the compact computing system of FIG. 1 (housing is removed).

Removing housing 202 can expose a central core of compact computing system 200. More specifically, FIG. 3 shows central core 300 of compact computing system 200 absent housing 202. Central core 300 can include a computing engine having computational components and a heat sink that can be used as a framework used to support at least some of the computational components. In this way, the computing engine takes on a form factor in accordance with that of the heat sink. Accordingly, the cylindrical shape of compact computing system 200 dictates the arrangement of various internal components as well as requirements for thermal management. For example, internal components can be arranged in an axial manner that optimizes both a component packing density (the number of operational components per available volume) and a computing power density (computing power per available volume). Moreover, the axial arrangement of internal components also optimizes an amount of heat that can be transferred to intake airflow 124 from the internal components and removed by way of exhaust airflow 114. (It should be noted that, in general, the nature of compact computing system 200 provides that intake airflow 124 be about the same as that of exhaust airflow 114.)

For example, memory module 302 can be formed of substrate 304 on which is mounted memory device 306. Substrate 304 can have major axis 310 that is parallel to peripheral airflow 312. In order to optimize heat transfer from memory device 306 to peripheral airflow 312, memory device 306 can be mounted onto substrate 304 in a manner that maximizes a thermal transfer interface with peripheral airflow 312. For example, each memory device can have a shape corresponding to a minor dimension (representing a width W, for example) and a major dimension (represented by a length L, for example). In the embodiment shown, the minor dimension W of memory device 306 is aligned generally parallel to peripheral airflow 312. In this way, a thermal transfer interface formed between peripheral airflow 312 and memory device 306 disposed on memory module 302 can be optimized. It should also be noted that peripheral airflow 312 is constrained by the presence of housing 202 to flow in a peripheral region defined by an interior surface of housing 202 and central core 300. Moreover, peripheral airflow 312 can be characterized as having substantially no radial components through the central portion where most heat generating components reside thereby further enhancing the heat transfer capability of peripheral airflow 312 with respect to memory module 302 and memory device 306. In this way, the axial components of peripheral airflow 312 align with the minor dimension W of memory device 306. It should be noted that intake airflow 124 is split into peripheral airflow 312 and central airflow 314 (not shown) that flows within a central portion of the central core 300. Accordingly, peripheral airflow 312 and central airflow 314 are combined forming exhaust airflow 114 prior to passing out of compact computing system 200 through second opening 106.

In the described embodiment, air mover 320 can be disposed in proximity to second opening 106 (cf. FIG. 1). It should be noted that air mover 320 could combine the central airflow 314 and peripheral airflow 312 back into exhaust airflow 114. Air mover 320 can include air exhaust assembly 322 that can be used to direct exhaust airflow 114 through second opening 106 at least some of which engages with exhaust lip 108 in a manner that facilitates the transfer of thermal energy generated by internal components of compact computing system 200. Air exhaust assembly 322 includes vents 324 to allow exhaust airflow 114 to pass through. Cosmetic shield 326 can be used to cover operational components such as RF circuits and antenna. In this regard, cosmetic shield 326 can be formed of RF transparent material such as plastic, ceramic, or other non-conductive materials.

Due to the electrically conductive nature of housing 202, housing 202 can be used as a chassis ground to provide a good ground for internal components. Accordingly, touch points 328 can be formed of conductive material and be used to form a conductive path between internal components and an interior of housing 202. It should be noted that in order to make a good electrical connection, portions of housing 202 contacting touch points 328 are devoid of any non-conductive or insulating material (such as aluminum oxide). Therefore, in those cases where housing 202 has an aluminum oxide layer formed thereon, selected portions of the aluminum oxide are removed (or that portion of housing 102 masked during the anodization operation) to expose bulk material in those locations that come into contact with touch points 328. As discussed above, in order to prevent leakage of electromagnetic energy, housing 202 and base unit 116 forms a Faraday cage.

In order to provide a user-friendly interaction with compact computing system 200, central core 300 may include sensors such as accelerometers disposed on a plurality of points. Thus, as the user handles housing 202 in order to position compact computing system 200 in a convenient location and orientation, illumination patterns can be used to highlight aspects of interface panel 206 so as to make portions of interface panel 206 more visible to the user. Accordingly, some of the sensors may include light sensing devices to determine whether or not there is sufficient ambient illumination for the user to see selected items on interface panel 206.

Figure 4:
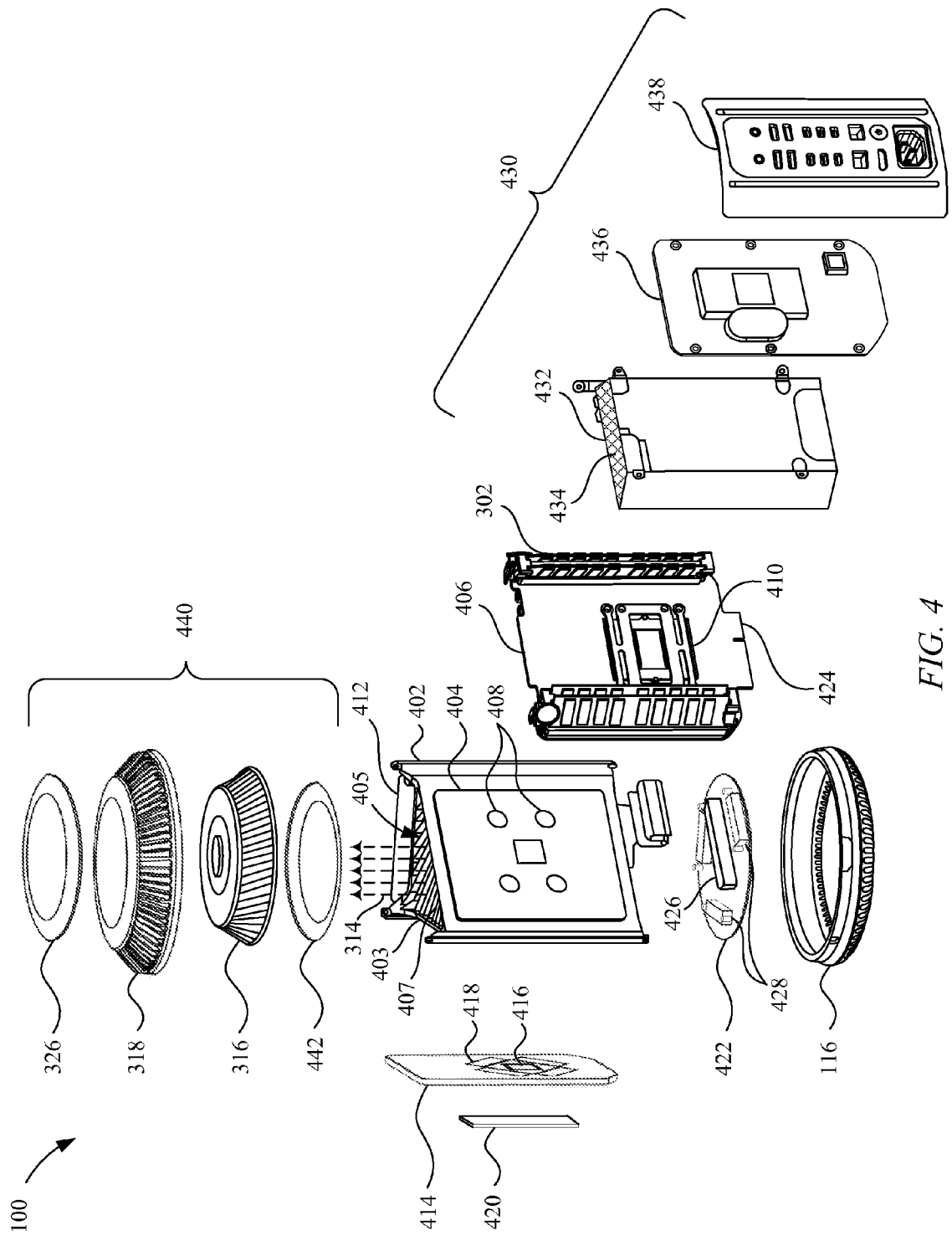
FIG. 4 shows an exploded view of the compact computing system in accordance with the described embodiments.

FIG. 4 shows a perspective exploded view of compact computing system 100. Heat sink 402 can include a plurality of planar faces 403 that define a central volume 405 having a triangular cross section along the lines of a triangular prism. Heat sink 402 can also act as a support structure, or a frame, upon which a computing engine that includes at least computational components of compact computing system 100 can be supported. In this way, the computing engine can take on the general shape of heat sink 402. In one embodiment, heat sink 402 can cooperate with an interior surface of housing 102 to define a peripheral zone that can be used as an air path for peripheral airflow used to cool at least some of the computational and operational components of compact computing system 100. Central volume 405 can also be used as an air path for a central airflow 314 to further cool at least some of the computational and operational components. In order to facilitate the cooling afforded by central airflow 314, heat sink 402 a plurality of cooling fins 407 that extend from a first planar face to at least a second planar face and spans the triangular central volume. In one embodiment, a center cooling fin can extend from the first planar face to a junction of the second and a third planar face. In this way, the center cooling fin can separate central volume 405 into two adjacent volumes each having similar triangular cross sections can include vapor chambers 404 that are disposed on each face 403 of heat sink 402.

Vapor chamber 404 can be used to distribute heat generated by various integrated circuits across each planar face of heat sink 402. CPU riser board 406, that can include a multi-core central processing unit (CPU) and memory modules 302 can be coupled to heat sink 402 by way of attachment points 408. Attachment points 408 can cooperate with CPU spring 410 to place the CPU in direct thermal contact with vapor chamber 404. CPU spring 410 can be utilized to provide a predefined amount of pressure between the CPU and its associated cooling stack and vapor chamber 404. Similarly, Graphics Processing Unit (GPU) riser board 412 and GPU riser board 414 can be similarly coupled to their respective faces of heat sink 402. GPU riser boards 412 and 414 each include a GPU 416 surrounded by Video Random Access Memory (VRAM) Chips 418. In this depiction, four VRAM chips 418 can be arranged in a diamond pattern around GPU 416. When GPU riser boards 412 and 414 are coupled to their respective vapor chambers 404, GPU 416 and each of VRAM chips 418 can be in direct thermal contact with a respective vapor chamber 404. It should be noted that in some configurations (not shown) a single vapor chamber can wrap around an edge of heat sink 402 such that integrated circuits mounted on GPU riser boards 412 and 414 can dissipate heat across vapor chamber having a substantially larger area. Such a configuration can be advantageous in single GPU operations. Furthermore, VRAM chips 418 can include thermal gap pads that put them in direct thermal contact with a vapor chamber 404 as VRAM chips tend to have a lower profile than proximate GPU 416. In this way, vapor chambers 404 thereby facilitate even spread of heat across each face of heat sink 402 during operation of compact computing system 100. Also depicted is Solid State Drive (SSD) module 420 which can be coupled to a rear face of GPU riser board 414.

Once each of riser boards 406, 412, and 414 are securely coupled to heat sink 402, each of the riser boards can be electrically coupled together across main logic board (MLB) 422. In some embodiments MLB 422 can include a System Management Controller (SMC) chip. CPU riser board 406 includes a card edge connector 424 that attaches to MLB 422 at card edge slot 426. In one embodiment, card edge connector 424 can be a PCI-E 3.0 type connector allowing at least 32 lanes of PCI-E to run between CPU riser board 406 and MLB 422. GPU Riser Boards 412 and 414 can be coupled to MLB 422 at flex jumper connectors 428. In this way, each of riser boards 406, 412, and 414 can be in electrical contact.

Compact computing system 100 also includes an input output (I/O) assembly 430. Input/Output (I/O) assembly 430 encompasses a number of components including power supply unit (PSU) 432. PSU 432 can supply external power to various components of compact computing system 100. In one embodiment PSU 432 can be configured to supply about 450 W of total power to compact computing system 100. PSU 432 can also include airflow perforations 434 that are configured to allow cooling air to flow through PSU 432 during operation of compact computing system 100. Airflow perforations 434 can be sized to regulate a flow of air through PSU 432. I/O assembly 430 also includes I/O board 436. I/O board 436 can be electrically coupled to MLB 422 by a flex jumper cable (not shown) when compact computing system 100 is completely assembled. I/O board 436 allows high-speed communications to enter and leave compact computing system 100. I/O assembly 430 also includes structural wall 438, which provides a cosmetic interface for users when installing and removing high-speed data cables or power cables from compact computing system 100. Once I/O assembly 430 is fully assembled, structural wall 438 can be coupled to a top lip portion of base unit 116.

FIG. 4 also provides a depiction of air exhaust assembly 440. Air exhaust assembly 440 includes plenum plate 442, impeller 316, air exhaust vents 318 and cosmetic shield 326. Plenum plate 442 can be operable to shape a flow of air into impeller 316. Plenum plate 442 can also be operable as a shroud for fan blades of impeller 316, which will be discussed in detail below. Impeller 316 and plenum plate 442 can be coupled to air exhaust vents 318. Cosmetic shield 326 can be secured to a top surface of air exhaust vents 318. Once fully assembled air exhaust assembly 440 can be coupled to a top portion of heat sink 402. In this way central core 300 can be assembled.

Figure 5:
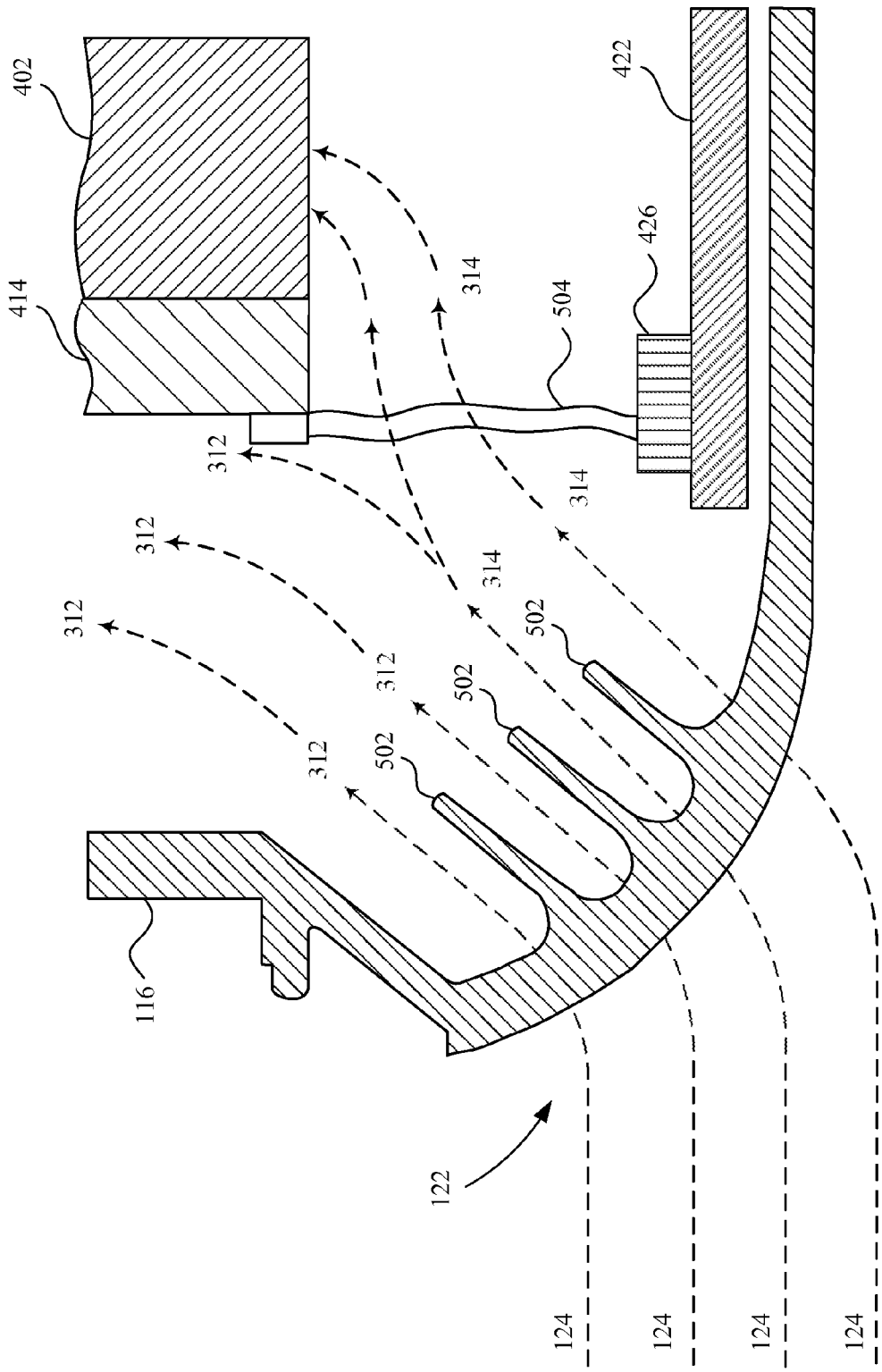
FIG. 5 shows a partial cross-sectional view of an air inlet of the compact computing system.

FIG. 5 shows a partial cross-sectional view of base unit 116 showing vents 122. As depicted, intake airflow 124 can be drawn into compact computing system 100 through vents 122. As intake airflow 124 passes through base unit 116, ribs 502 help to direct airflow entering compact computing system 100. In some embodiments, ribs 502 can facilitate the transition of intake airflow 124 into peripheral flow 312 and central airflow 314. In the described embodiment, a first portion of intake airflow 124 can be directed by ribs 502 towards the central volume of heat sink 402 in the form of central airflow 314. In one embodiment, a baffle arrangement 504, also referred to as an airflow splitter, can be used to split intake airflow 124 into the central airflow 314 as described above and a second portion into the peripheral airflow 312. In one embodiment, a flex jumper cable 504 can be used as the airflow splitter. In this way, flex jumper cable 504, in addition to electrically coupling GPU riser board 414 to MLB 422, can redirect proportionate amounts of intake airflow 124 into the central airflow 314 and the peripheral airflow 312. For example, flex jumper cable 504 can bias more of airflow 124 towards a central portion of GPU riser board 414 than over peripheral edges of the board. Widening or narrowing flex jumper cable 504 can adjust an amount of air that is redirected up GPU riser board 414. It should be noted that a distance between a bottom surface of GPU riser board 414 and MLB 422 can be adjusted to bias more or less air to enter central airflow 314.

Figure 6A:
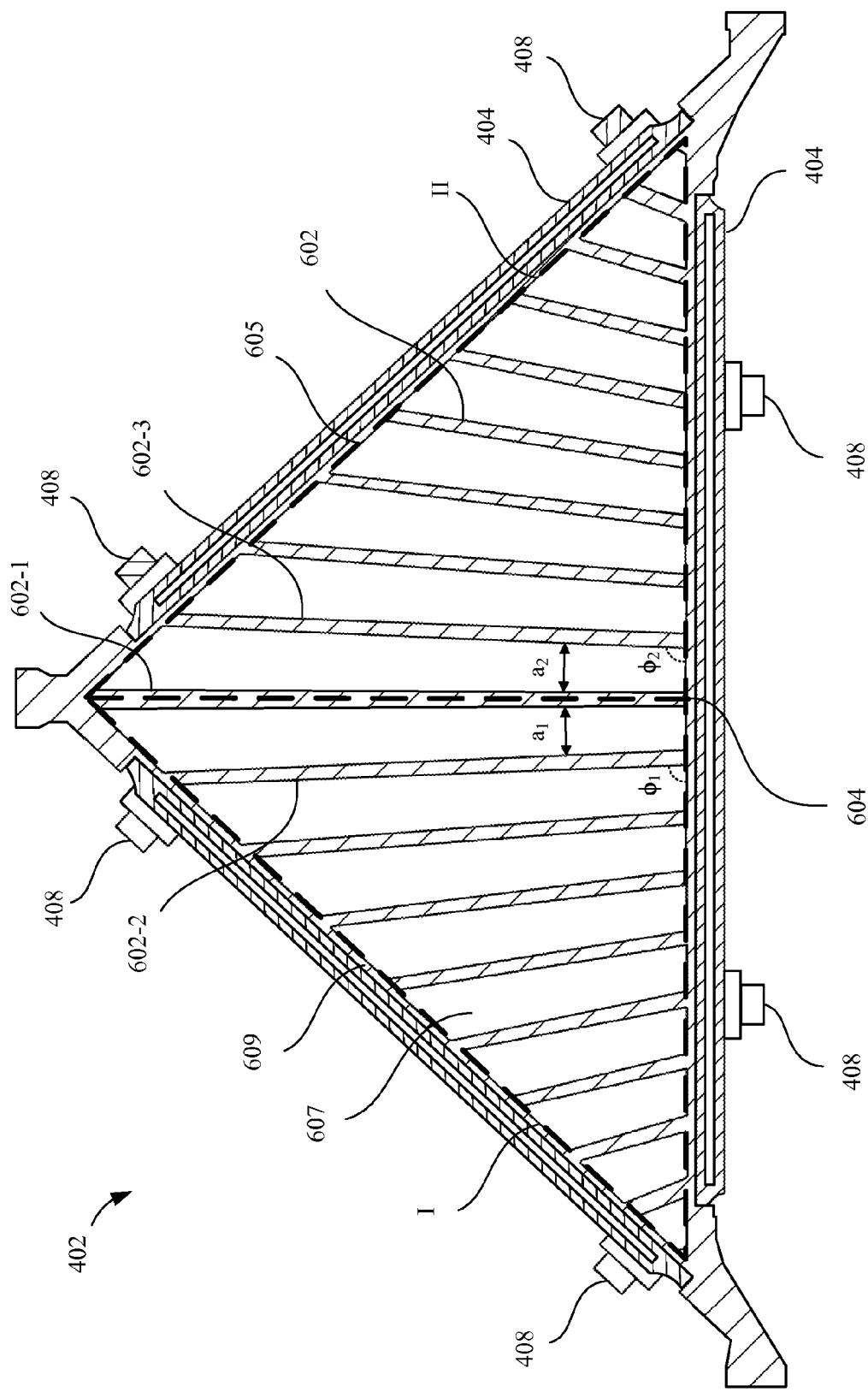
FIG. 6A shows a cross-sectional top view of a fin stack of the compact computing system.

FIG. 6A shows a top cross-sectional view of heat sink 402. Machining a number of features from an extruded aluminum block can form heat sink 402. In one embodiment, a plurality of cooling fins 602 can be attached to the interior surfaces of planar faces of heat sink 402 while in another embodiment, plurality of cooling fins 602 can be created as a part of the extrusion process during which the planar faces of heat sink 402 are formed. In either case, plurality of cooling fins 602 can be distributed in a number of ways. In one embodiment, all of plurality of cooling fins 602 can extend from first planar face 604 to at least second planar face 605 spanning triangular central volume 607. In an embodiment, one of the plurality of cooling fins 602 (referred to as center cooling fin 602-1) can extend from first planar face 604 to a junction of second planar face 605 and third planar face 609. In this way, the triangular central volume defined by heat sink 402 is bisected into first region I and second region II each having similar right triangular cross sections. In one embodiment, first cooling fin 602-2 spanning region I can be at first angle Ø1 with respect to first planar face 604. First angle Ø1 can have an angular value that varies in accordance with a distance $a_1$ between first cooling fin 602-2 and central cooling fin 602-1. Similarly, second cooling fin 602-3 spanning region II can be at second angle Ø2 with respect to first planar face 604. Second angle Ø2 can have an angular value that also varies in accordance with a distance $a_2$ between second cooling fin 602-3 and central cooling fin 602-1. Generally speaking, distance $a_1$ and distance $a_2$ are about equal, however, the number of cooling fins actually implemented in either regions I or II can vary as required for a particular design as can the various geometric relationships. In one embodiment, a summation of first angle Ø1 and second angle Ø2 can be about 180°.

Any of the planar faces can be modified to accommodate various components. For example, a portion of first planar face 604 can be removed by any number of processes to leave a low profile mounting position for vapor chamber 404. Vapor chamber 404 can be adhesively or mechanically fixed to the first planar face 604. Vapor chamber 404 can have very efficient heat conduction properties, on the order of about 10 times the heat conduction efficiency of copper. In some embodiments a conductive gel can be placed between vapor chamber 404 and heat sink 402 to facilitate efficient heat transfer between vapor chamber 404 and heat sink 402. Vapor chamber 404 can also include attachment points 408. Attachment points 408 can be integrally formed with vapor chamber 404 and are configured to provide a means for attaching the various riser boards associated with compact computing system 100 to the vapor chambers.

Figure 6B:
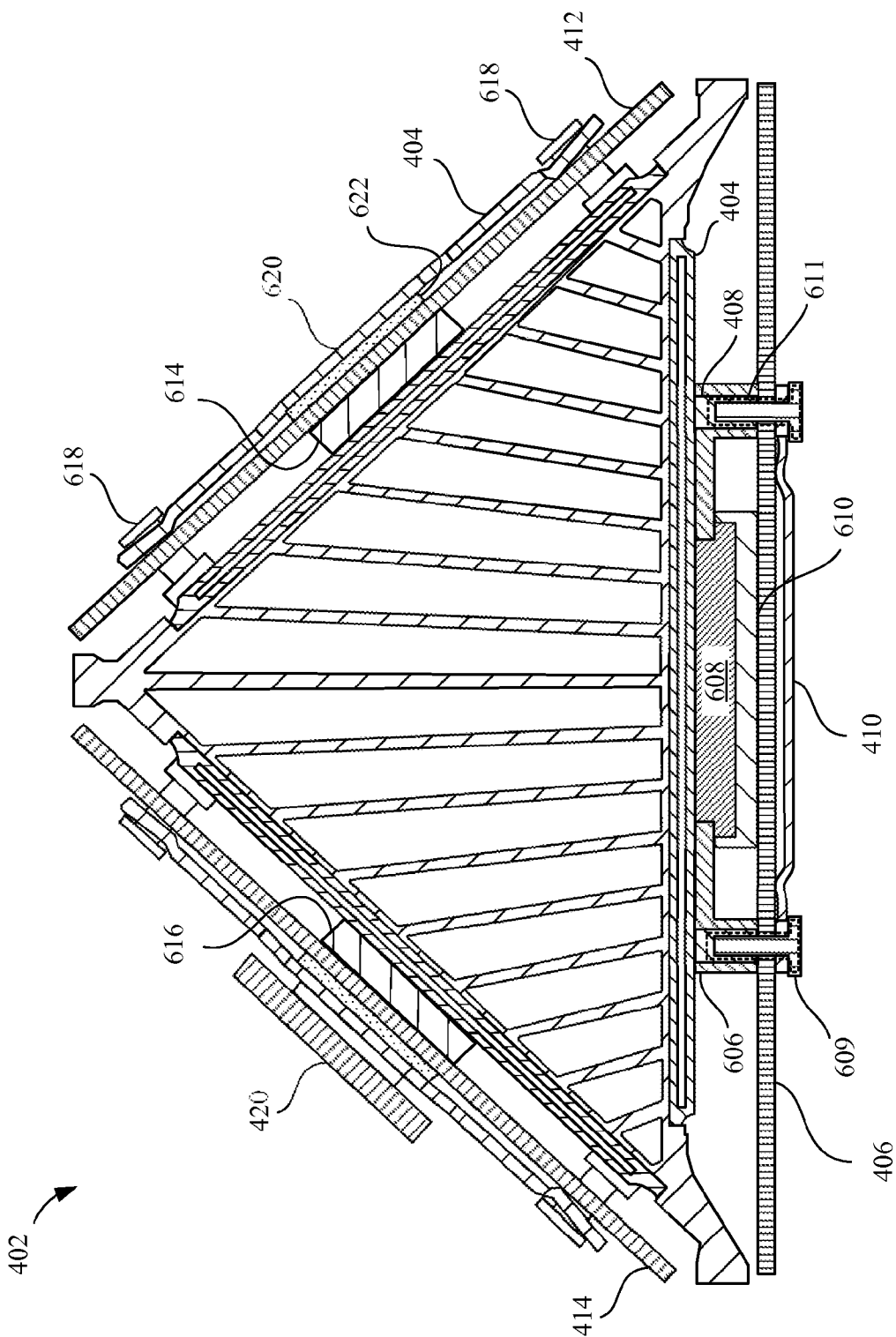
FIG. 6B shows a cross-sectional top view of a fin stack of the compact computing system.

FIG. 6B illustrates another cross-sectional view of heat sink 402 with a number of riser boards attached. CPU riser board 406 is shown attached to vapor chamber 404. CPU riser board 406 attaches to vapor chamber 404 through a low profile thermal module 606. Low profile thermal module 606 can be configured to properly seat CPU 608 on socket 610 of CPU riser board 406. In some embodiments low profile thermal module 606 can exert about 100 pounds of force on CPU 608. This 100 pounds of force can be balanced by CPU spring 410 disposed on the opposite side of CPU riser board 406. CPU spring 410 can be a U-shaped spring that when flattened counteracts the force of low profile thermal module 606. CPU spring 410 can be made of any number of robust materials. In one embodiment CPU spring 410 can be made from 17-7 precipitation hardening stainless steel.

In addition to seating CPU 608, low profile thermal module 606 can have apertures through which fasteners 609 (also referred to as fasteners 714 in FIG. 7B) can engage attachment points 408 of vapor chamber 404. The fasteners 611 (also referred to as fasteners 716 in FIG. 7B) coupling CPU riser board 406 to vapor chamber 404 can be used to establish a robust thermal interface between CPU 608 and vapor chamber 404. Fasteners 611 are disposed behind fasteners 609 and are represented as dashed lines in the cross-sectional view of FIG. 6B. In some embodiments about 30 pounds of force can be applied between CPU 608 and vapor chamber 404. In addition to seating CPU 608, CPU spring 410 can also be utilized to help set the 30 pounds of force between CPU 608 and vapor chamber 404. This applied force allows robust thermal contact to be established between CPU 608 and vapor chamber 404 as well as securely attaching CPU riser board 406 to heat sink 402. GPU riser boards 412 and 414, having GPU 614 and GPU 616 respectively, can be mechanically coupled to the other faces of heat sink 402. Similarly to CPU riser board 406, GPU riser boards 412 and 414 can be coupled to their respective vapor chambers. For example, GPU riser board 412 can be coupled to its respective vapor chamber by fasteners 618.

Fasteners 618 can couple to attachment points disposed on the vapor chamber, and an amount of pressure between vapor chamber 404 and GPU 614 can be balanced by GPU spring 620. Fasteners 618 can cooperate with GPU spring 620 to provide a predetermined amount of force to seat GPU riser board 412 to heat sink 402. In one embodiment, GPU 614 can be soldered to GPU riser board 412 eliminating the need for additional applied pressure in order to seat GPU 614 within a socket. It should also be noted that in some embodiments GPU riser board 412 can include stiffener 622 which can be operable to receive a force from GPU spring 620 and provide additional structural support to GPU riser board 412. It should also be noted that one (as depicted) or both GPU riser boards 412, 414 can include SSD module 420. SSD module 420 can be coupled to a rear surface of one or both GPU riser boards 412, 414.

Figure 6C:
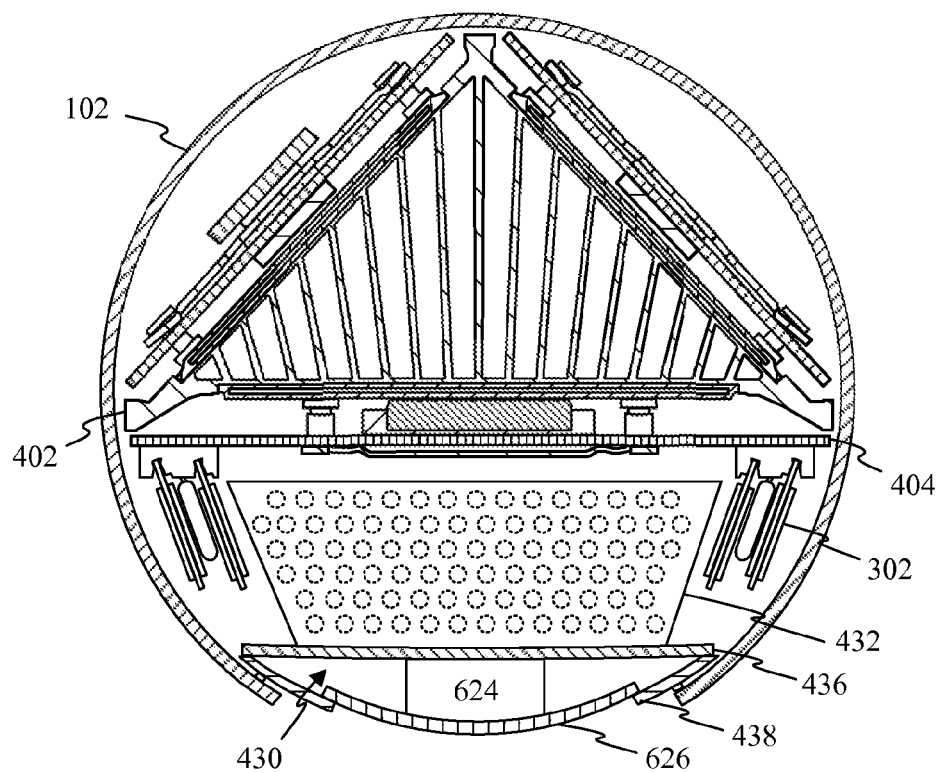
FIGS. 6C-6D show cross-sectional top views of compact computing system and airflow regions through which cooling air can pass.

FIG. 6C shows yet another cross-sectional view of heat sink 402 disposed within housing 102. In addition to showing housing 102 surrounding heat sink 402, I/O assembly 430 is depicted as well. I/O assembly 430 includes PSU 432, I/O board 436, and structural wall 438. I/O assembly 430 includes a number of dotted holes representing perforations in a top surface of PSU 432. In some embodiments, the perforations of PSU 432 can be sized to adjust a flow of air through PSU 432. Disposed on an outward facing surface of I/O board 436 is connector column 624, which represents a column of connectors accessible to a user through I/O inlay 626. In one embodiment I/O inlay 626 can be a RF transparent hard plastic that is highly resistant to scratching.

Figure 6D:
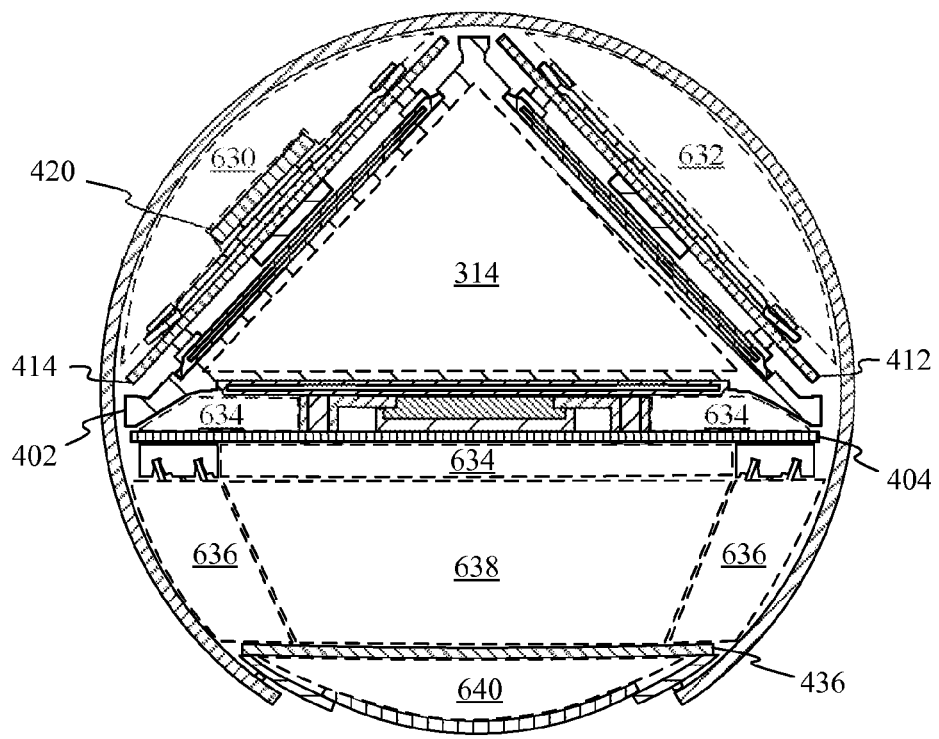

FIG. 6D shows the same cross section from FIG. 6C divided into airflow regions. Central airflow 314 is depicted in FIG. 6D as an airflow path that parallels the longitudinal axis of housing 102 and within the triangular central region of heat sink 402. As shown in more detail in FIG. 7A, peripheral airflow 312 can diverge into a plurality airflow branches one of which can be directed along a back portion of the GPU riser boards and shown as GPU airflow regions 630 and 632. It should be noted that various computational components can have duty cycles that generate copious amounts of thermal waste heat. For example, SSD module 420 can be disposed on only GPU riser board 414. SSD module 420 can cause substantially more heat to be emitted into GPU airflow region 630 than GPU airflow region 632, given otherwise similar operating parameters of both GPU riser boards 412, 414. In such a case, balancing operations can be implemented to offload GPU operations from GPU riser board 414 to GPU riser board 412, thereby balancing heat dissipation across airflow regions 630 and 632.

A portion of peripheral airflow 312 can be directed along both sides of CPU riser board, as depicted by airflow regions 634. In this way, CPU riser board 406 can receive convective cooling on both front and rear surfaces. Airflow regions 636 represent airflow that applies convective cooling to memory (DIMM) modules 302. Airflow region 638 represents a portion of peripheral airflow 312 that is routed through PSU 432. As mentioned above, perforations in a top surface of PSU 432 can be sized to adjust an amount of airflow through PSU 432. Finally, airflow region 640 can represent a volume of air directed along I/O board 436. Various airflow guides can be utilized to facilitate establishing an optimal amount of airflow for each airflow regions. For example, in one embodiment ribs 502 can have varying angles depending on their angular position on base unit 116 (that in some embodiments can be releasable), to help distribute the airflow to a desired airflow region. In one embodiment, almost 50% of the air passing through compact computing system 100 can be directed into central airflow 314. In such a configuration about 10% can be drawn through airflow region 638, and the remaining approximately 40% of the airflow can be divided across the other airflow regions.

Figure 7A:
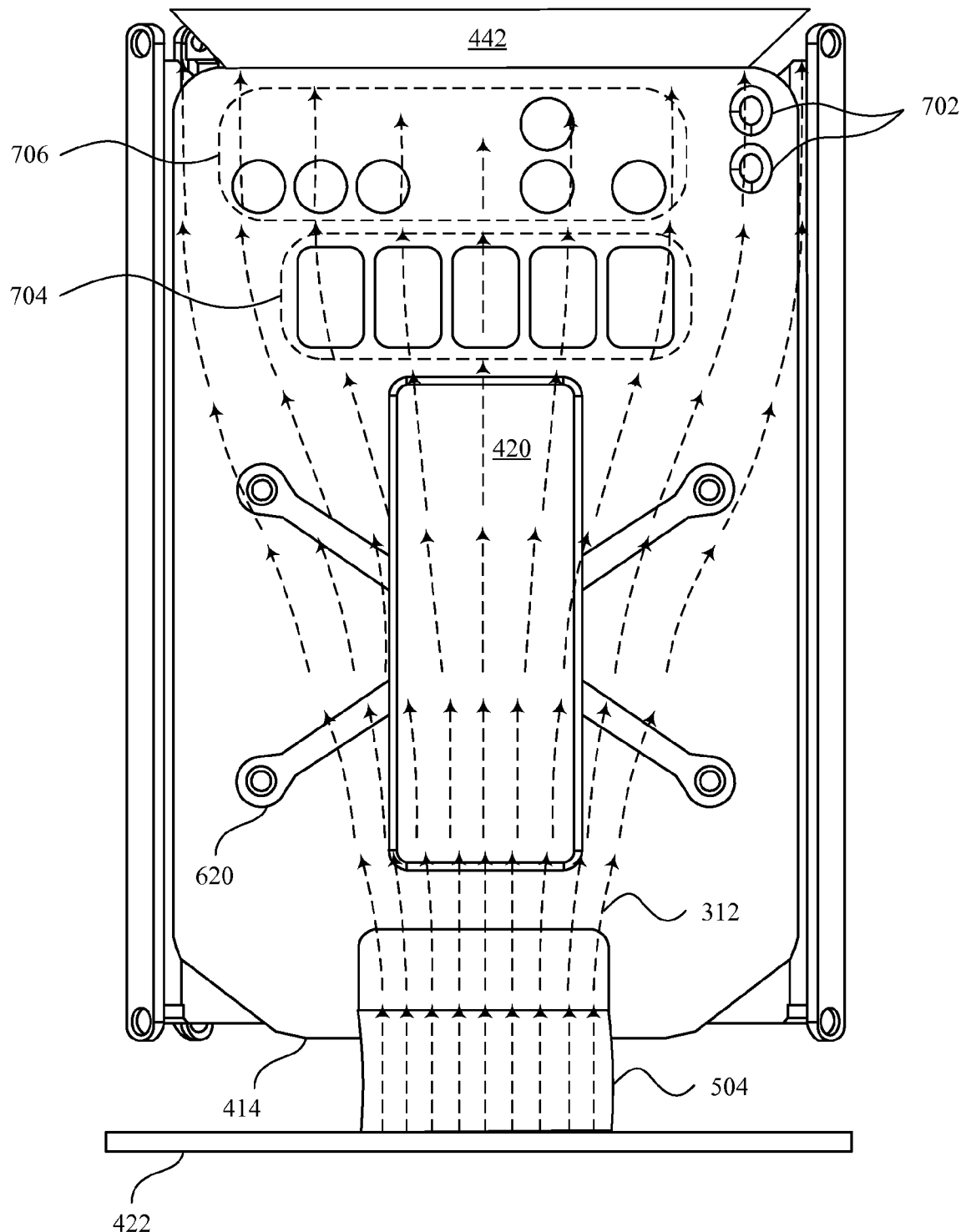
FIG. 7A shows a side view of one of the GPU riser boards and how airflow can be distributed across it.

FIG. 7A illustrates a side view of GPU riser board 414. Airflow over GPU riser board 414 is indicated as peripheral airflow 312, which as described in relation to FIG. 5 can be diverted up over GPU riser board 414 by flex jumper cable 504. This leaves a disproportionately large amount of peripheral airflow going over a central portion of GPU riser board 414. This can be advantageous in embodiments such as the one depicted where heat emitting bodies such as SSD module 420 and GPU (not shown) are disposed in a central portion of GPU riser board 414. As peripheral airflow 312 travels up GPU riser board 414 it can naturally spread out along the GPU riser board 414. In addition to the natural normalization of airflow 312 the spreading of airflow 312 can be further encouraged by an interaction between a top portion of GPU riser board 414 and plenum plate 442. Because peripheral portions of GPU riser board 414 are disposed at a greater radial distance from a center point of circular plenum plate 442, a larger gap is left for air to rush over GPU riser board 414 and into impeller 316 (not shown). Consequently, an outer peripheral portion of peripheral airflow 312 can be greater in the upper portion of GPU riser board 414. The upper portion of GPU riser board 414 can be configured such that heat-emitting components can benefit from the more uniform distribution of airflow 312. For example, DC inputs 702 can emit a substantial amount of heat. Furthermore, power-conditioning modules 704 can be spread at even intervals across GPU riser board 414. Capacitors 706 can also greatly benefit from convective cooling provided by peripheral airflow 312. It should be noted that many of the heating bodies, including for example SSD module 420 and power conditioning modules 704, as depicted, can be disposed vertically so the airflow over them and resulting convective heat transfer is maximized. It should be noted that peripheral airflow 312 over GPU riser board 412 can be substantially similar to the airflow depicted with regards to GPU riser board 414.

Figure 7B:
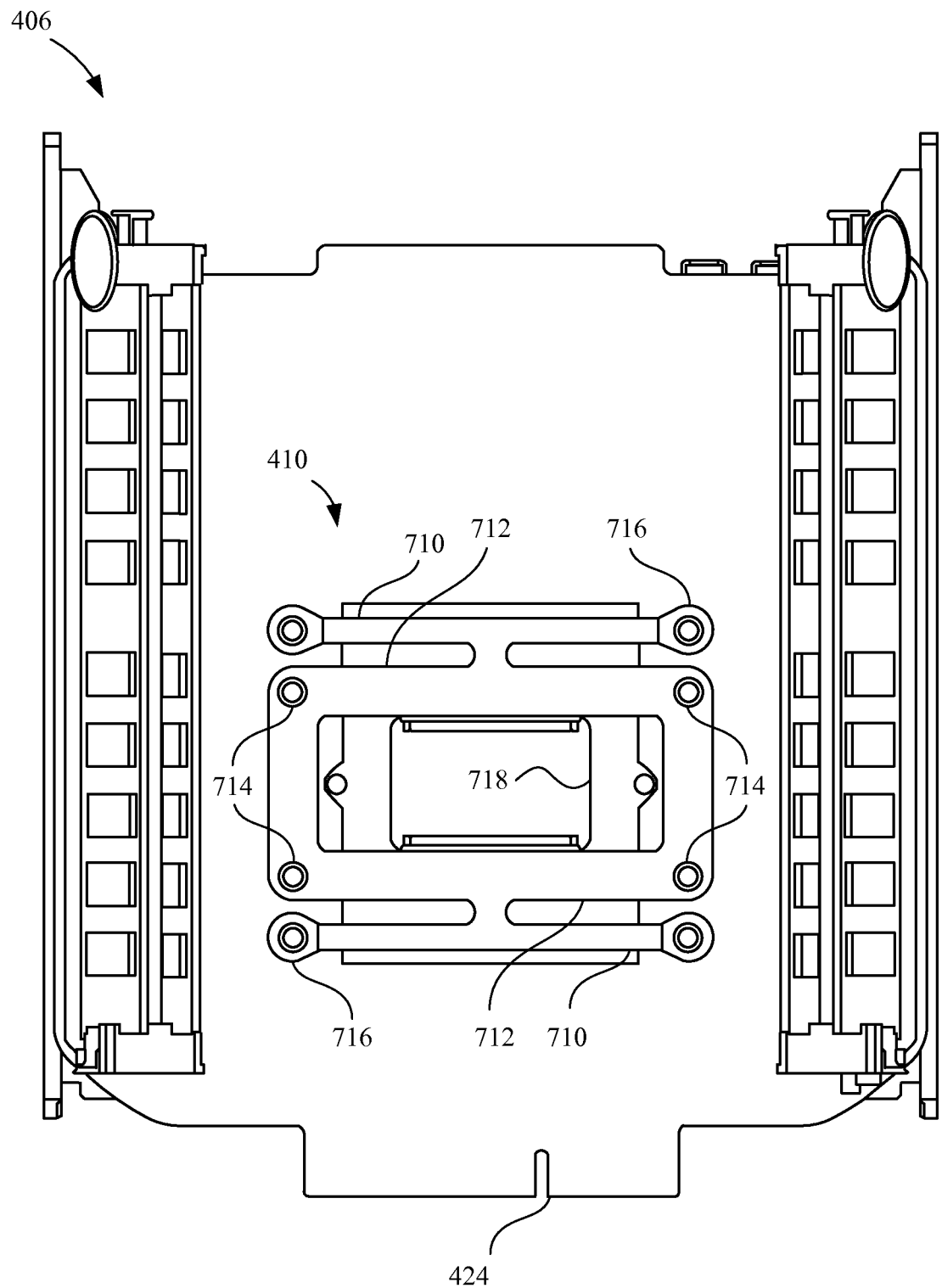
FIG. 7B shows a side view of the CPU riser board and specifically points out features of the CPU spring.

FIG. 7B illustrates a side view of CPU riser board 406. This view is provided to show additional detail of CPU spring 410. CPU spring 410 as previously discussed can be constructed from a U-shaped 17-7 precipitation hardened stainless steel alloy. Force can be applied by fasteners along CPU spring 410 to flatten it against a rear side of CPU riser board 406 as depicted. CPU spring 410 can include a number of various sized bands. CPU spring bands 710 as depicted are thicker than CPU spring bands 712 and provide the about 200 pounds of force needed to seat a CPU (not shown) to CPU riser board 406. Fasteners 714 extend only into low profile thermal module 606, allowing CPU spring 410 to securely seat a CPU on CPU riser board 406 prior to installing CPU riser board 406 on heat sink 402. Fasteners 716 are configured to apply about 30 pounds of force through narrower CPU spring bands 712 and additionally operate to couple CPU riser board 406 to attachment points 408 of the vapor chamber configured to receive CPU riser board 406. It should be noted that stiffener 718 can be disposed between CPU spring 410 and CPU riser board 406 to provide additional structural rigidity to CPU riser board 406.

Figure 8:
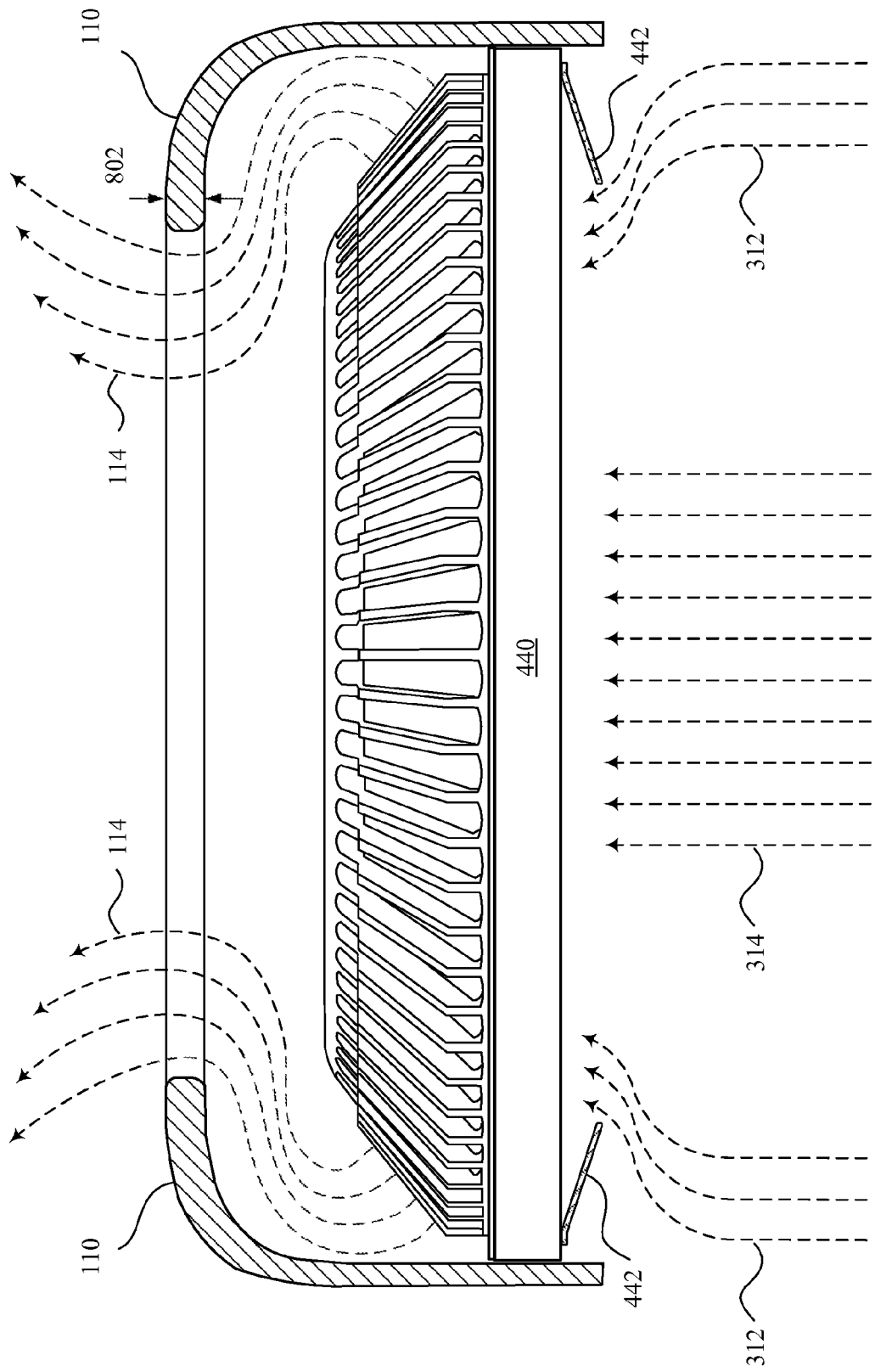
FIG. 8 shows a partial cross-sectional side view of how cooling air is exhausted out of the compact computing system.

FIG. 8 illustrates a partial cross sectional side view of air exhaust assembly 440 disposed within a top portion of housing 102. Central airflow 314 is combined with peripheral airflow 312 at air exhaust assembly 440. Air exhaust assembly 440 includes impeller 316 that is responsible for drawing air through compact computing system 100 during operation of the device. Impeller 316 receives central airflow 314 and peripheral airflow 312, and combines them back into exhaust airflow 114. As depicted, exhaust airflow 114 is exhausted with axial and centrifugal components, consequently impeller 316 can be said to be a mixed flow fan. The axial components of exhaust airflow 114 reduce an amount of pressure drop when exhaust airflow 114 contacts portion 110 of housing 102, as the flow does not undergo as much redirection as it would if it exited air exhaust assembly 440 in a substantially centrifugal direction. The axial components of exhaust airflow 114 also help to reduce a transfer of heat between exhaust airflow 114 and portion 110 of housing 102. In this way, a normal operating temperature of portion 110 of housing 102 can be kept at a low enough temperature to allow a user to comfortably maneuver housing 102. It should be noted that exhaust airflow 114 can be further conditioned to exit air exhaust assembly 440 in a substantially radial direction so that air can be expeditiously moved out of housing 102. Swirling patterns can develop when exhaust airflow 114 contains non-radial components, causing additional pressure drop and increased convective heat transfer to housing 102.

Heat distribution about housing 102 can be further controlled as a function of a thickness 802 of portion 110 of housing 102. In one embodiment, thickness 802 can be on the order of about 4-6 mm, allowing heat to be efficiently conducted circumferentially about housing 102. In this way hot spots can be prevented form forming along housing 102. As depicted, the thickness 802 of housing 102 can be gradually tapered going down as most heat received by housing 102 is near a top portion. Consequently, the heat can be evenly spread circumferentially at the top allowing the narrower lower portion to simply conduct the heat away from the upper opening in housing 102. In some embodiments impeller 316 can be configured to pull air through compact computing system 100 at a rate of about 28-29 cubic feet per minute, while keeping the overall acoustic output of compact computing system below 37 dB.

Figure 9A:
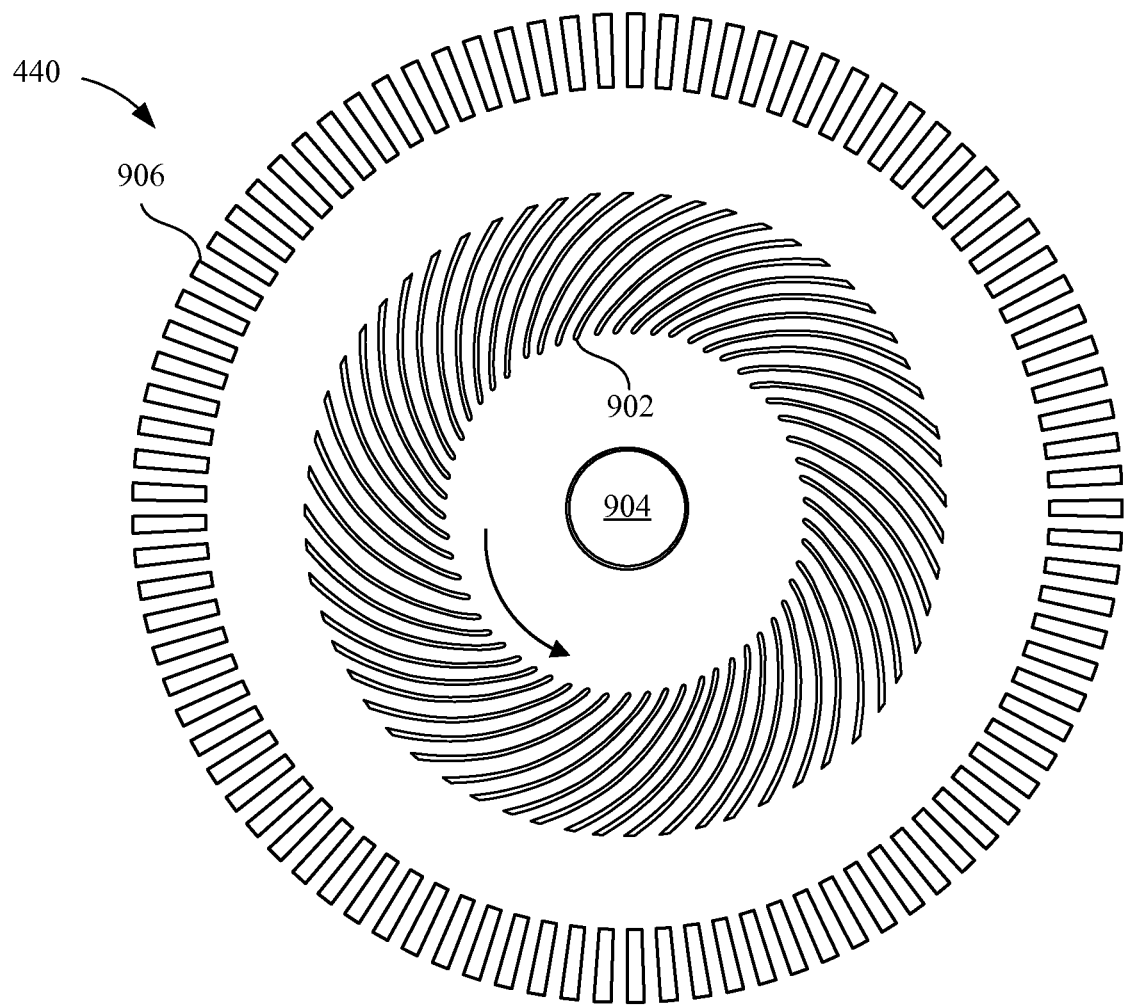
FIGS. 9A-9B show fan blade configurations of an impeller in accordance with the described embodiments.

FIG. 9A shows a cross-sectional top view of air exhaust assembly 440. In this depiction, impeller 316 can have 57 impeller blades 902. In some embodiments, impeller blades 902 can be disposed about hub 904 at non-uniform intervals. For example, an angular distance between proximate fan blades can vary between about 5.5 and 7 degrees. This irregular spacing can help reduce an acoustic profile of impeller 316. Table 1 below shows one particular blade spacing configuration that can be utilized with the 57 impeller blades 902 of impeller 316. Additionally, impeller blades 902 can have backward curved blades to bias exhaust airflow 114 in a radial direction.

TABLE 1

(angular spacing between blades)

| Blade # | Angular Spacing (deg) |
| --- | --- |
| 1 | 6.92 |
| 2 | 6.2399 |
| 3 | 6.1458 |
| 4 | 5.7145 |
| 5 | 5.9564 |
| 6 | 5.7037 |
| 7 | 5.7124 |
| 8 | 5.8201 |
| 9 | 6.3916 |
| 10 | 6.1342 |
| 11 | 6.2996 |
| 12 | 6.8305 |
| 13 | 6.3928 |
| 14 | 6.9324 |
| 15 | 6.79 |
| 16 | 6.3158 |
| 17 | 6.6752 |
| 18 | 6.332 |
| 19 | 6.8873 |
| 20 | 6.9171 |
| 21 | 6.529 |
| 22 | 6.8115 |
| 23 | 6.1026 |
| 24 | 6.7456 |
| 25 | 5.7116 |
| 26 | 5.6961 |
| 27 | 6.1673 |
| 28 | 5.8777 |
| 29 | 5.8416 |
| 30 | 5.9396 |
| 31 | 6.1763 |
| 32 | 6.692 |
| 33 | 5.8011 |
| 34 | 6.4961 |
| 35 | 6.4858 |
| 36 | 6.305 |
| 37 | 5.886 |
| 38 | 5.6992 |
| 39 | 6.1355 |
| 40 | 6.9192 |
| 41 | 6.4834 |
| 42 | 6.3266 |
| 43 | 6.395 |
| 44 | 6.2282 |
| 45 | 6.4552 |
| 46 | 6.9279 |
| 47 | 6.7538 |
| 48 | 6.9354 |
| 49 | 6.926 |
| 50 | 6.4034 |
| 51 | 6.1482 |
| 52 | 6.4643 |
| 53 | 5.7442 |
| 54 | 5.7055 |
| 55 | 6.4974 |
| 56 | 6.2366 |
| 57 | 6.2388 |

Figure 9B:
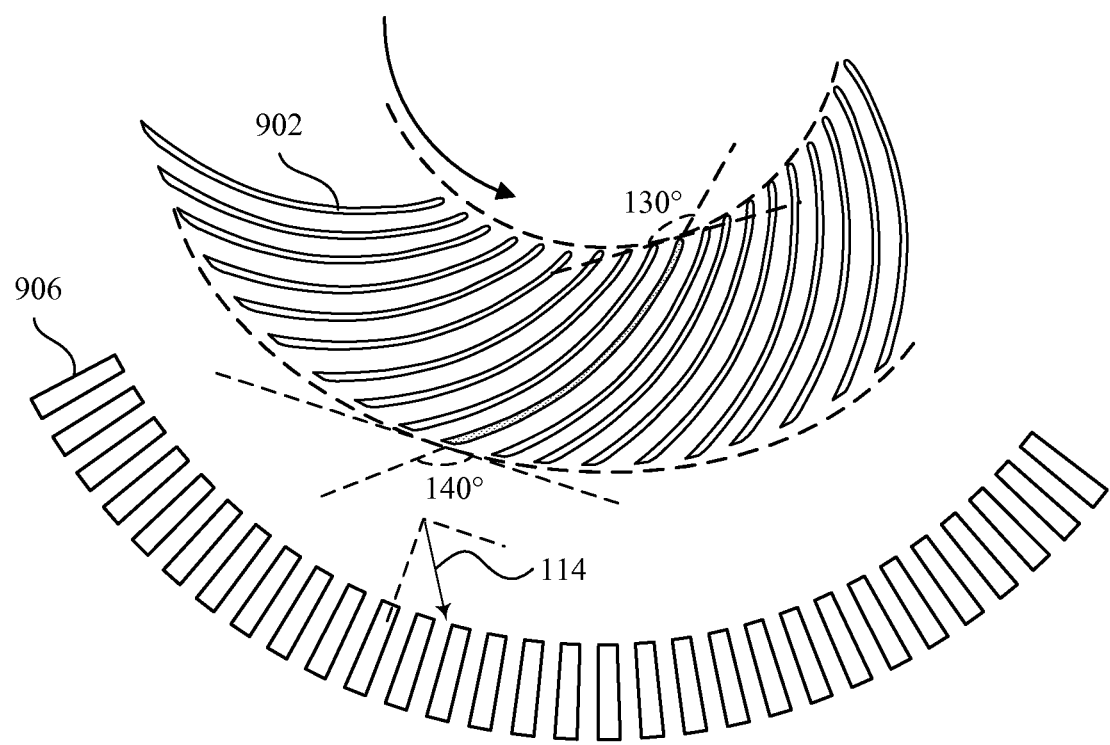

FIG. 9B shows a portion of the cross-section shown in FIG. 9A. Specifically, fan blade 902 can be configured such that a trailing edge of fan blade 902 is inclined about 10 degrees more than a leading edge of fan blade 902. In one embodiment, as depicted, the leading edge of fan blade 902 can have an angle of 130 degrees, whereas the trailing edge of fan blade 902 can have an angle of about 140 degrees. Even though fan blades 902 are backward swept, as a result of the direction of rotation of impeller 316, airflow exiting impeller 316 can still have a circumferential component as it exits impeller 316. Radially oriented 906 can be configured to substantially straighten exhaust airflow 114 as it passes through stators 906 by removing tangential components from airflow 114. As a result, the direction of mean airflow leaving the stators 906 is more closely aligned to the radial direction.

Figure 10A:
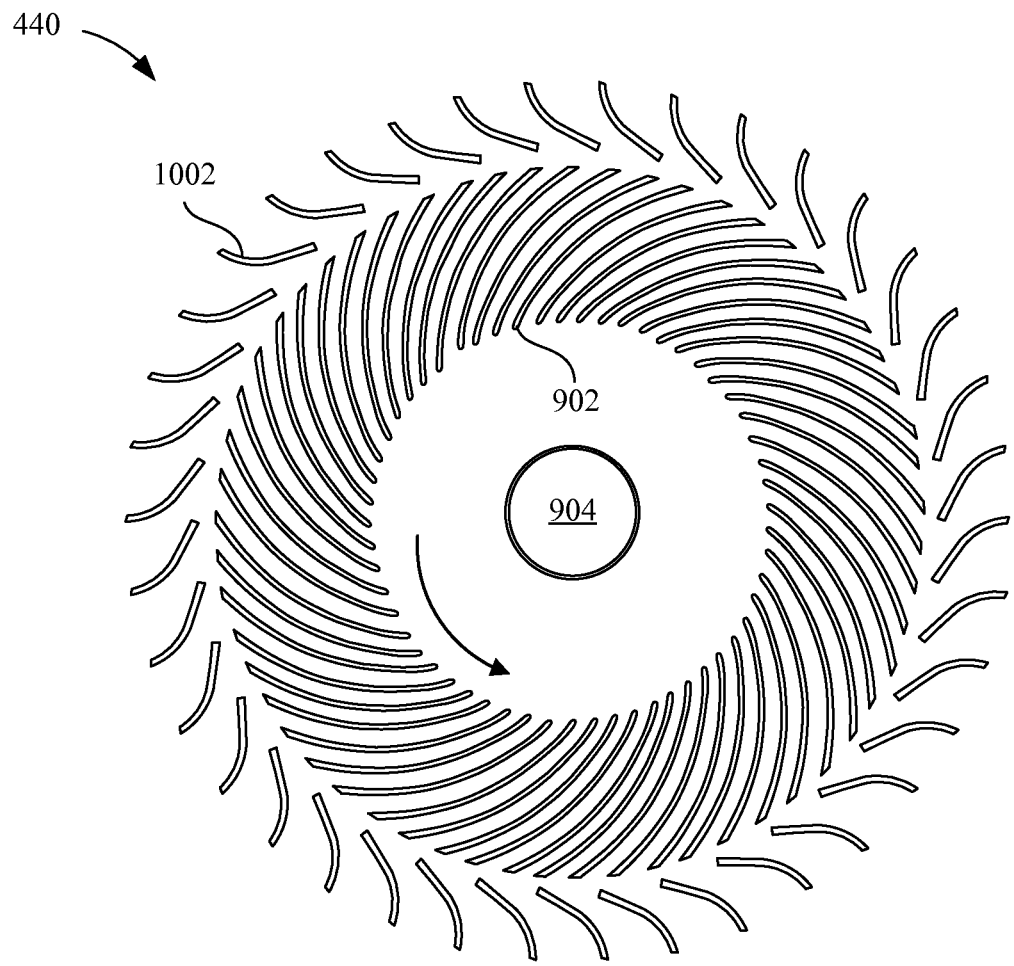
FIGS. 10A-10B show fan blades of an impeller configured with curved stator blades.
Figure 10B:
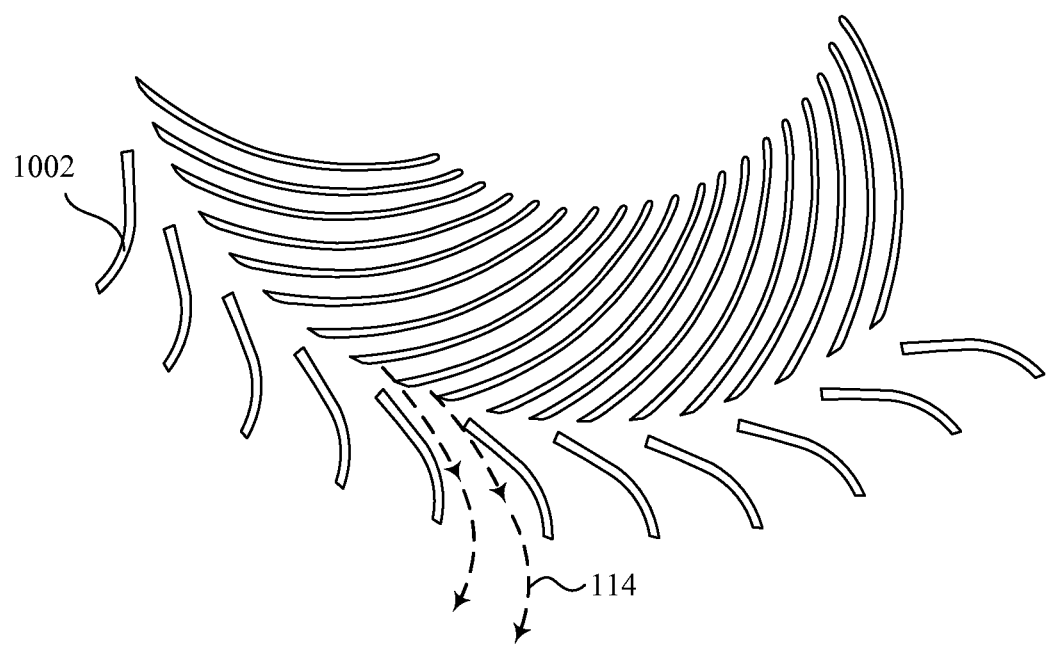

FIGS. 10A-10B show cross-sectional top views of an alternative embodiment of air exhaust assembly 440. In this embodiment, stator blades 1002 can have a curved geometry and be oriented in an opposite direction to provide a more gradual redirection of exhaust airflow 114. This configuration can reduce flow energy lost to turbulence due to separation from stator blade surfaces. In one set of trials a similarly configured curved stator configuration produced about 30% more pressure capacity than a similarly configured system with straight stator blades. In other embodiments straight stator blades can be oriented in a direction similar to depicted curved stator blades 1002.

Figure 11A:
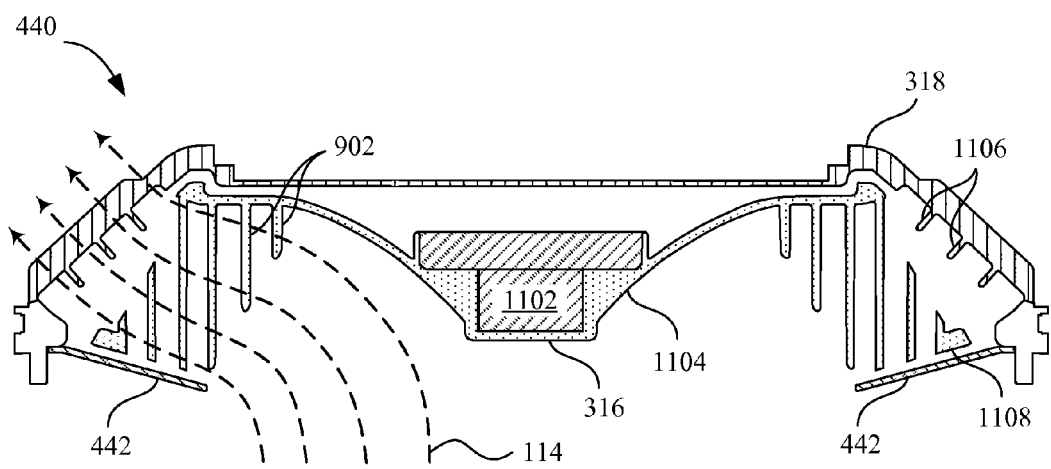
FIGS. 11A-11B show a cross-sectional side view and a bottom view of an air exhaust assembly in accordance with the described embodiments.

FIG. 11A shows a partial cross-sectional side view of air exhaust assembly 440, including impeller 316, air exhaust vents 318, and plenum plate 442. Impeller 316 can be driven by fan motor 1102. Fan motor 1102 can be a small form factor motor allowing airflow entrance losses to be reduced as well as allowing more volume for blades 902 should this be desired. In one particular embodiment fan motor 1102 can be a thrust bearing. Due to the compact nature of the thrust bearing, impeller 316 can have a contoured lead-in region 1104 that helps exhaust airflow 114 to have an axial component as it leaves impeller 316. Air exhaust vents 318, in addition to including stator blades to make exhaust airflow 114 substantially radial also includes ribs 1106 to add an additional axial component to exhaust airflow 114 as it exits air exhaust assembly 440. It should be noted that exhaust airflow 114 is shown only on the left side of impeller 316 for exemplary purposes only and would also travel through the right side of impeller 316. In this embodiment, plenum plate 442 functions as a shroud for impeller 316.

Figure 11B:
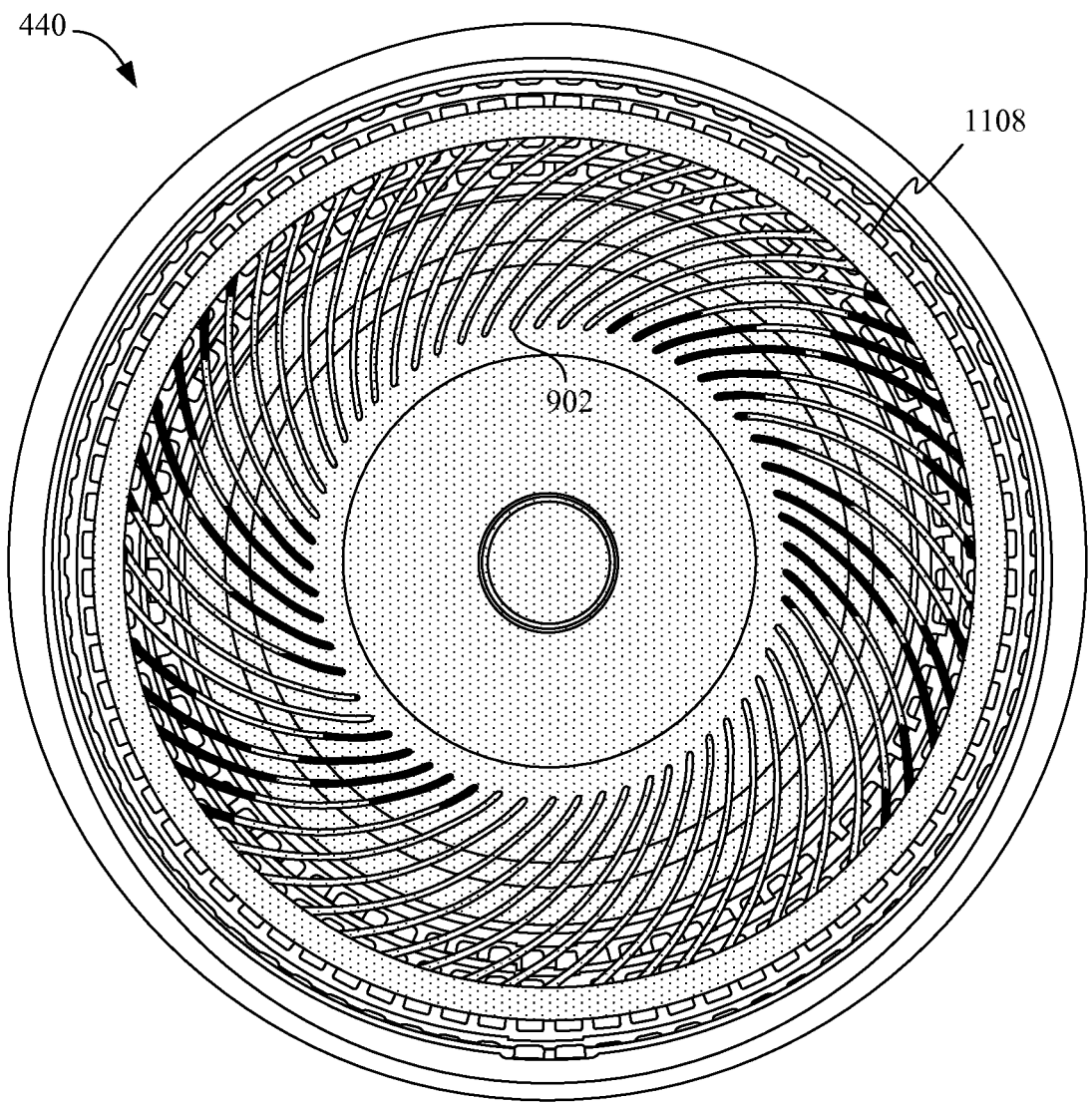

FIG. 11B shows a bottom view of air exhaust assembly 440 without plenum plate 442. In this depiction, impeller 316 is shown specifically without a bottom shroud or shroud plate. This configuration can allow impeller 316 to be more easily manufactured in a single piece, versus having to manufacture a distinct shroud plate. Furthermore, such an implementation allows the use of support ring 1108 to dispose at a bottom, peripheral edge of impeller 316. Support ring 1108 can add structural stability to fan blades 902. Support ring 1108 can also be used to help balance impeller 316. For example, a notch or aperture can be designed within support ring 1108 to help remedy a small balance problem that could be associated with impeller 316. Support ring 1108 can also beneficially provide a small axial component to air that passes over support ring 1108 on its way out of air exhaust assembly 440.

Figure 12A:
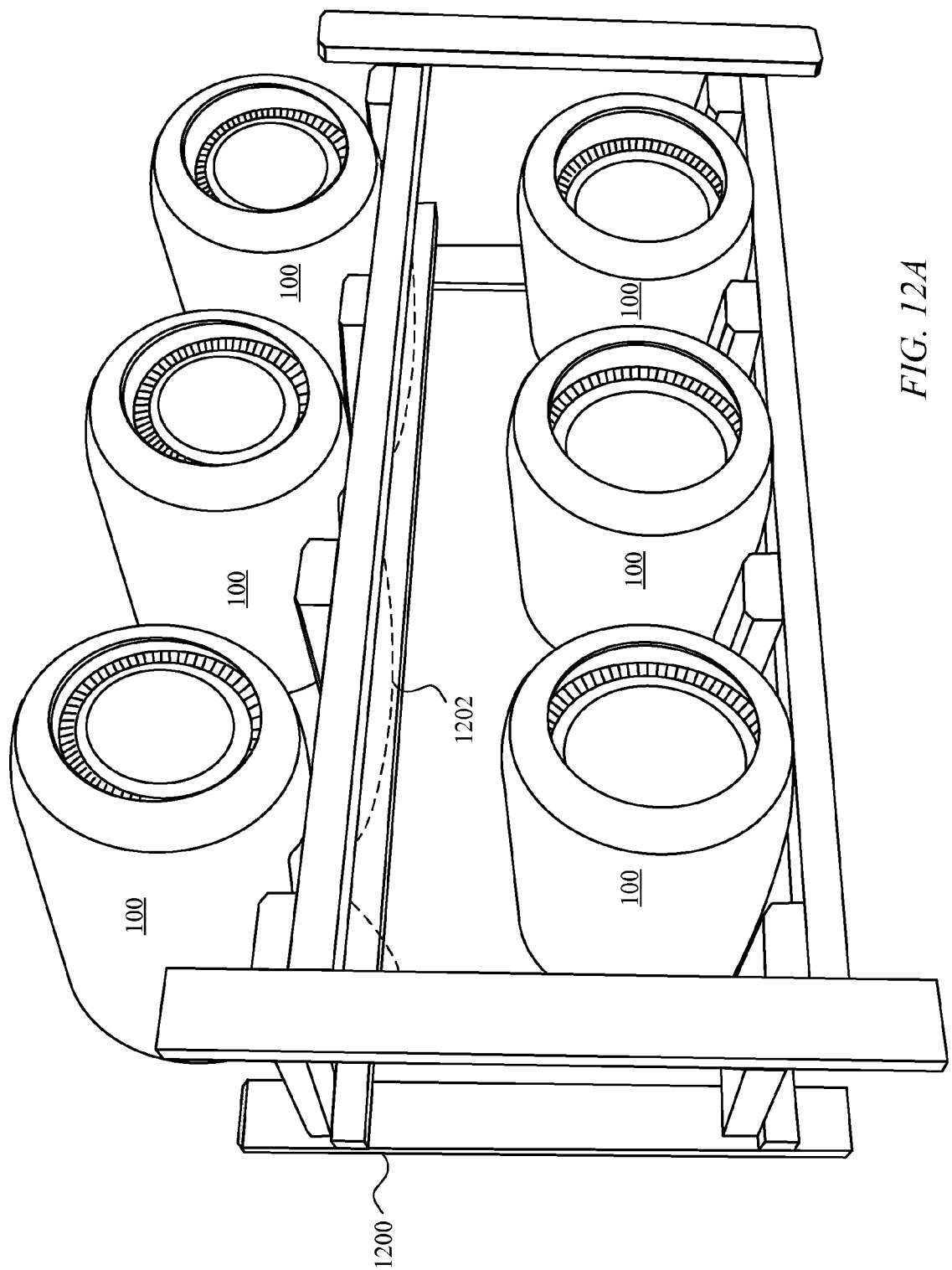
FIG. 12A shows a rack arrangement suitable for supporting a number of the compact computing systems.
Figure 12B:
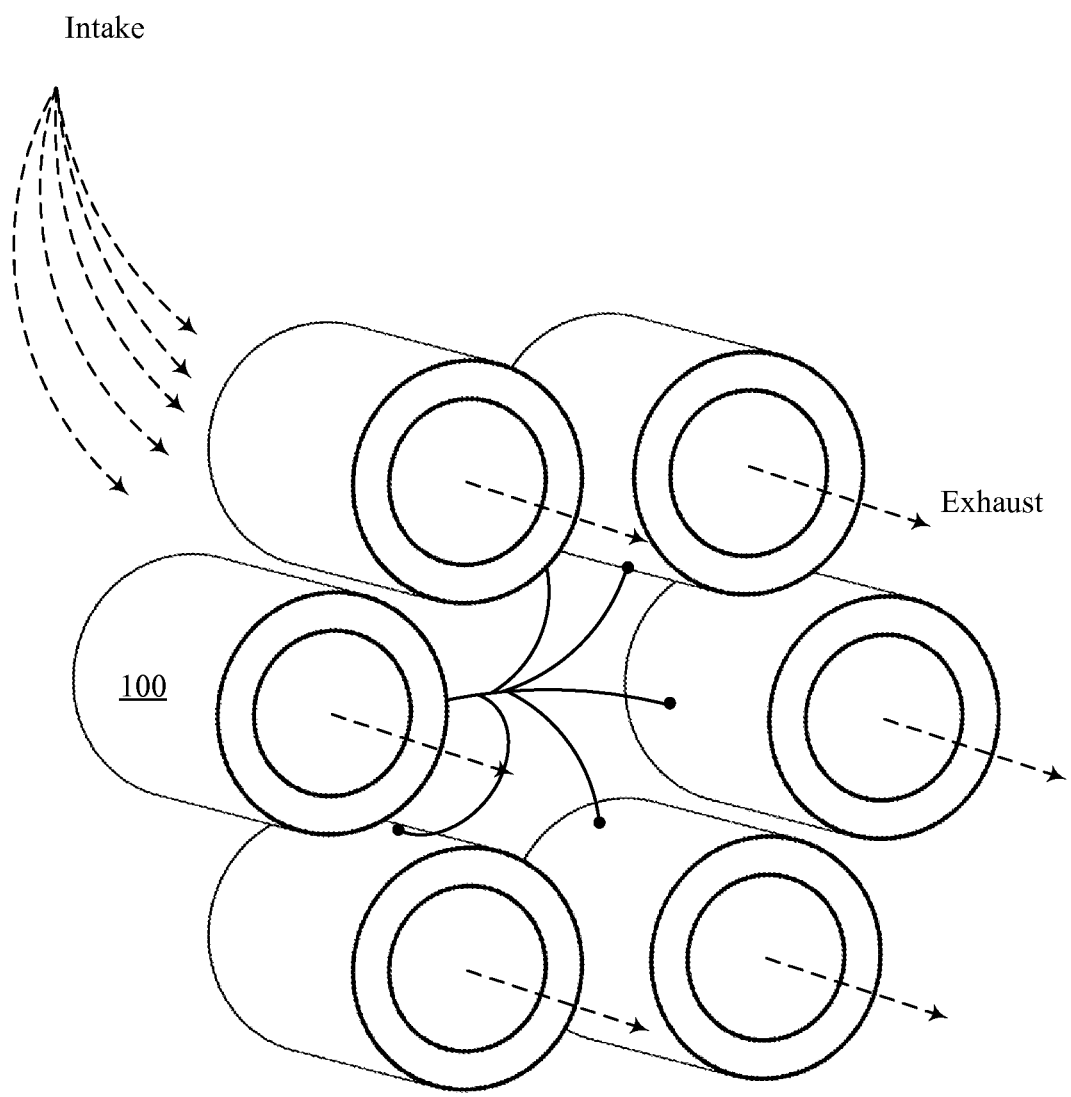
FIGS. 12B-12C shows various other rack arrangements suitable for supporting a number of compact computing systems.
Figure 12C:
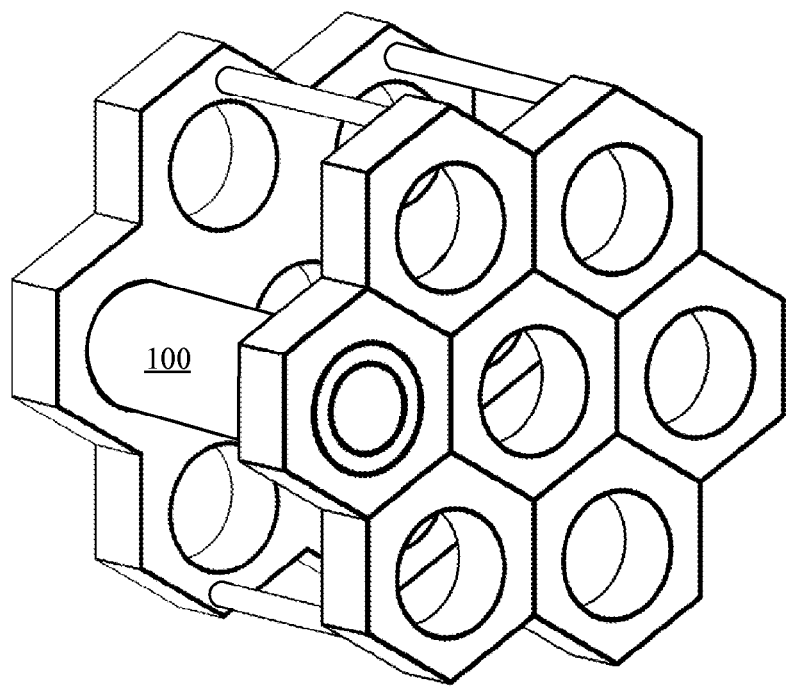
Figure 12C:
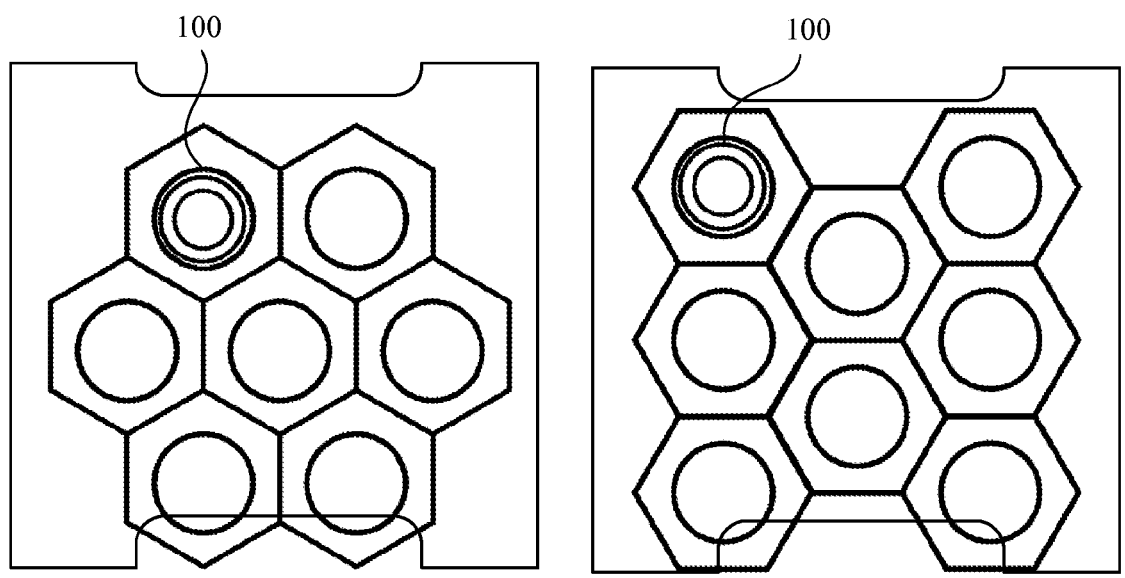

FIG. 12A shows a rack arrangement 1200 suitable for supporting a number of compact computing systems 100 in accordance with any of the described embodiments. In this depiction, cooling air can be pulled in on one side of rack arrangement 1200 and exhausted on another side. In this way exhaust air from one compact computing system is not likely to be re-circulated into an intake of a nearby computing device. Compact computing systems arranged in such a manner can also be in direct communication via data connectors 1202. Data connectors 1202 can be embodied by Ethernet cables, Thunderbolt® cables, or any number of other high-speed data transfer protocols. In some embodiments the depicted compact computing systems can be in wireless communication. FIG. 12B shows a configuration in which a number of compact computing system are slaved to a master compact computing system, thereby allowing the master compact computing system to allocate resources of the various other compact computing systems. FIG. 12C shows various other arrangements compatible with compact computing systems 100. A perspective view and cross sectional view of one embodiment is depicted showing a hexagonal arrangement of compact computing systems. In another arrangement the compact computing systems can be arranged in a linear, cubic arrangement.

Figure 13:
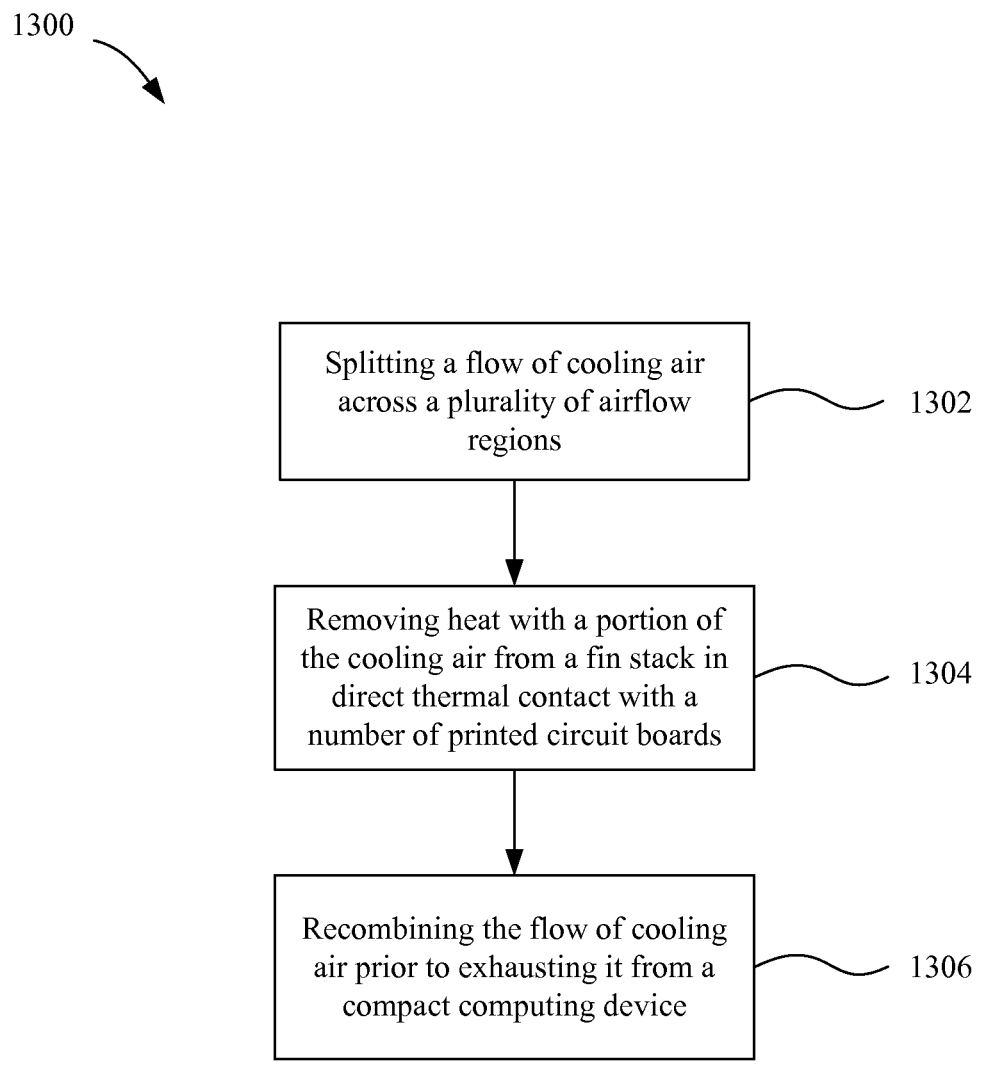
FIG. 13 is a block diagram illustrating a method for cooling a compact computing system.

FIG. 13 describes a method 1300 for cooling a compact computing system. At step 1302 a flow of cooling air entering the compact computing system is split across a plurality of airflow regions. At step 1304 a portion of the flow of cooling air removes heat from a fin stack in direct thermal contact with a number of printed circuit boards (PCBs). Another portion of the cooling air can be utilized to simultaneously apply convective cooling to a rear portion of each of the number of PCBs. At step 1306, the flow of cooling air is recombined before being exhausted from the compact computing system.

Figure 14:
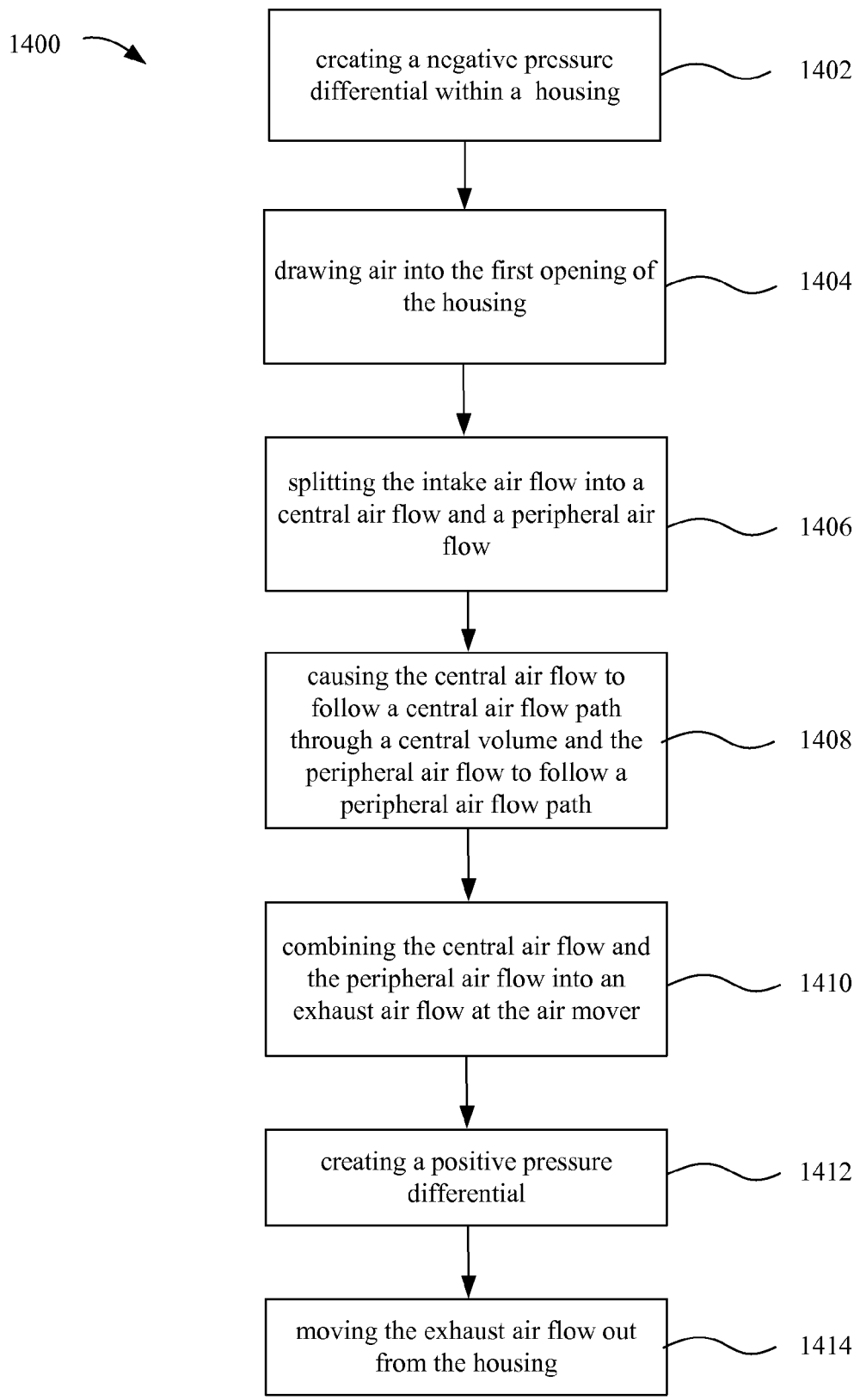
FIG. 14 is a flowchart detailing a process in accordance with the described embodiments.

FIG. 14 is a flowchart detailing process 1400 for removing heat from a desktop computer having a cylindrical housing having a first opening at a first end and a second opening axially disposed from the first opening at a second end in accordance with the described embodiments. Process 1400 is carried out by at 1402 creating a negative pressure differential within the cylindrical housing with respect to an external environment near the first opening by an air mover located near the second opening. At 1404, drawing air into the first opening of the cylindrical housing from the external environment in response to the negative pressure differential as an intake airflow. At 1406, splitting the intake airflow into a central airflow and a peripheral airflow by an airflow splitter located near the first opening. At 1408, causing the central airflow to follow a central airflow path through a central volume and the peripheral airflow to follow a peripheral airflow path through a peripheral volume separate from the central volume by the air mover. At 1410, combining the central airflow and the peripheral airflow into an exhaust airflow at the air mover. At 1412, creating a positive pressure differential with respect to the external environment near the second opening by the air mover. At 1414, moving the exhaust airflow out from the cylindrical housing into the external environment in response to the positive pressure differential.

Figure 15:
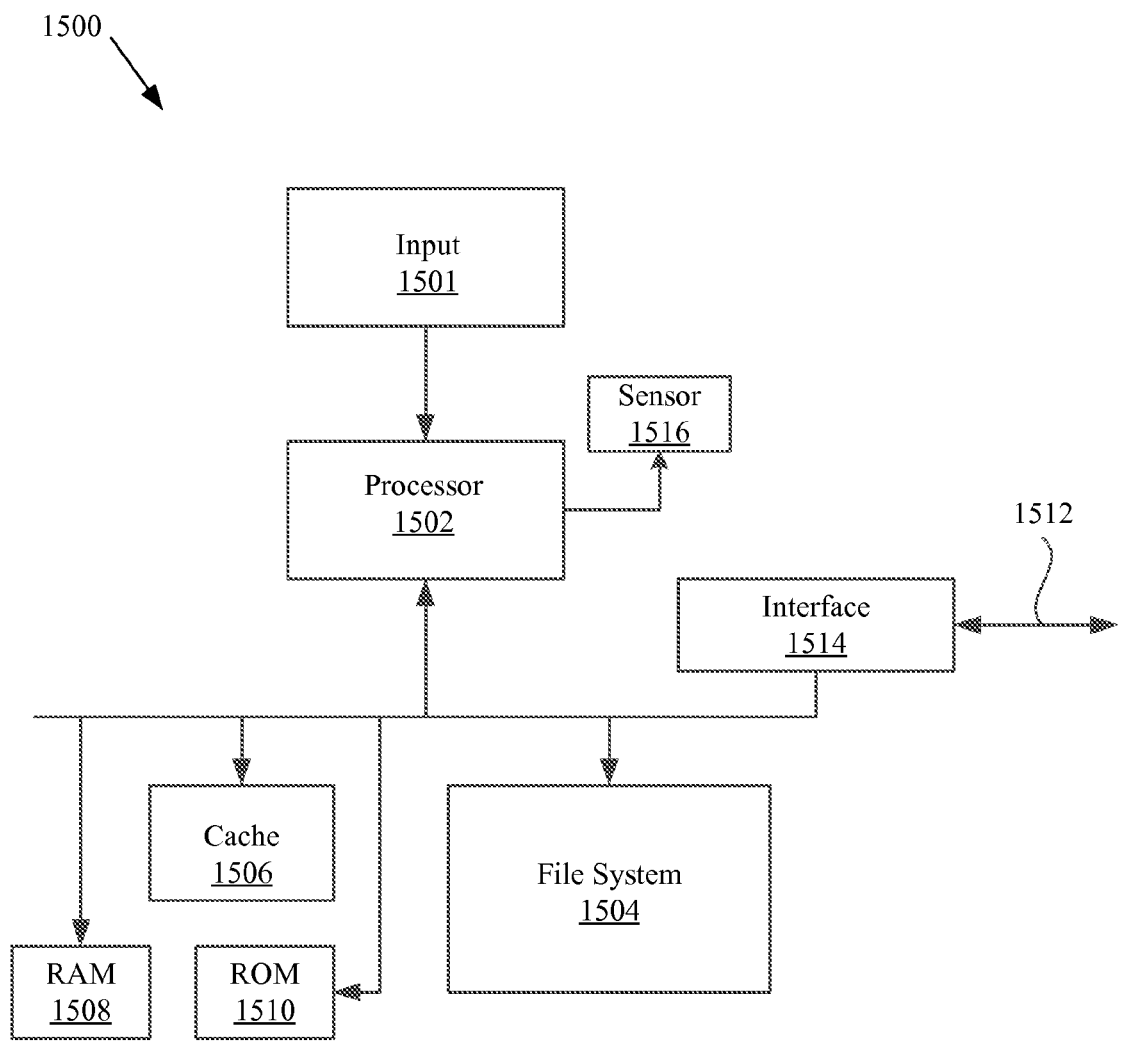
FIG. 15 is a block diagram of a representative computing system.

FIG. 15 is a block diagram of a computing system 1500 suitable for use with the described embodiments. The computing system 1500 illustrates circuitry of a representative computing system. The computing system 1500 includes input 1501 coupled to processor 1502 that pertains to a microprocessor or controller for controlling the overall operation of the computing system 1500. It should also be noted that processor 1502 can also refer to multi-processor system. For example, computing system 1500 can include a single or multiple central processing units (CPUs) in addition to a single or multiple dedicated function processors such as a graphics processing unit (GPU). The computing system 1500 stores data (such as media data) in a file system 1504 and a cache 1506. The file system 1504 typically provides high capacity storage capability for the computing system 1500. The cache 1506 is, for example, Random-Access Memory (RAM) provided by semiconductor memory. The computing system 1500 can also include a RAM 1508 and a Read-Only Memory (ROM) 1510. The ROM 1510 can store programs, utilities or processes to be executed in a non-volatile manner.

The computing system 1500 also includes a network/bus interface 1514 that couples to a data link 1512. The data link 1512 allows the computing system 1500 to couple to a host computer or to accessory devices. The data link 1512 can be provided over a wired connection or a wireless connection. In the case of a wireless connection, the network/bus interface 1514 can include a wireless transceiver. The media items (media data) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 1516 can take the form of circuitry for detecting any number of stimuli. For example, sensor 1516 can include a Hall Effect sensor responsive to external magnetic field, an audio sensor, a light sensor such as a photometer, and so on.

Various embodiments are described herein. These embodiments include at least the following.

A thermal management system for a desktop computer having a housing with a longitudinal axis that encloses an internal volume that is symmetric about the longitudinal axis is described that includes at least a heat sink disposed within the internal volume that includes a plurality of planar faces that define and at least partially enclose a central thermal zone having a cross section that is perpendicular to the longitudinal axis. The thermal management system also includes an air mover that moves air through at least the central thermal zone.

A thermal management system for removing heat from a desktop computer that includes a housing having a longitudinal axis and that at least partially defines and encloses an internal volume that is symmetric about the longitudinal axis includes a heat sink positioned within the internal volume. The heat sink includes a plurality of planar faces that define a central airflow region having a cross section in the shape of a polygon that is perpendicular to the longitudinal axis. At least one of the plurality of planar faces includes an interior surface integrally formed with a cooling fin that extends from the interior surface and spans the central airflow region to an interior surface of at least another one of the plurality of planar faces, and an exterior surface configured to carry a computational component in thermal contact with the heat sink.

A heat removal system for a computing device enclosed within a cylindrical housing is described. The heat removal system includes a plurality of vents configured to receive an intake airflow in accordance with a pressure differential across the plurality of vents and to direct the intake airflow along a longitudinal axis of the cylindrical housing where the plurality of air vents is disposed at a first end of the cylindrical housing. The heat removal system also includes a baffles arrangement disposed between the plurality of vents and the longitudinal axis of the cylindrical housing, the baffles arrangement configured to bifurcate the intake airflow into a central airflow and a peripheral airflow, the central airflow directed towards a central portion of the computing device and the peripheral airflow directed towards a peripheral portion of the computing device, and an air exhaust system disposed at a second end of the cylindrical housing opposite the first end, the air exhaust system configured to receive and combine the central airflow with the peripheral airflow, and to exhaust the combined airflow through an opening in the cylindrical housing at the second end.

A method for removing heat generated by a computational component disposed within an air passage enclosed and defined by a housing having a first opening at a first end and a second opening at a second end opposite the first end is carried out by drawing an intake airflow into the air passage at the first opening by an air mover located near the second opening, splitting the intake airflow into a central airflow that passes through a central portion of the air passage and a peripheral airflow that concurrently passes through a peripheral portion of the air passage separate from the central portion of the air passage, where the computational component transfers at least some heat to the central airflow and the peripheral airflow, combining the central airflow and the peripheral airflow into an exhaust airflow by the air mover, and removing the heat from the housing by causing the exhaust airflow to move out of the housing through the second opening.

A thermal management system for a cylindrical desktop computer includes at least an air exhaust assembly suitable for cooling the cylindrical desktop computer. The air exhaust assembly includes an impeller that includes a hub, a plurality of fan blades protruding radially from the hub, adjacent ones of the plurality of fan blades disposed about the hub at an irregular angular interval, and a support ring integrally formed along a bottom surface of a trailing edge portion of each of the plurality of fan blades, the support ring operative to provide at least structural support to the plurality of fan blades. The thermal management system also includes a plurality of stator blades configured to inhibit formation of radial components in the exhausted airflow.

A thermal management system for use in a desktop computer includes an impeller comprising a plurality of fan blades and an air exhaust grill surrounding the impeller and comprising a plurality of air vents through which an exhaust airflow moves out of the desktop computer. The plurality of air exhaust vents includes a plurality of ribs configured to cooperate with the plurality of fan blades to increase an axial component of the exhaust airflow, and a plurality of stators configured to remove a tangential component of the air passing through the air exhaust grill.

A heat sink for removing heat from a desktop computer that includes a housing having a longitudinal axis and that at least partially defines an internal volume that is symmetric about the longitudinal axis and a computing engine positioned within the internal volume having a computational component includes a plurality of planar faces that defines a central thermal zone having a cross section that is substantially perpendicular to the longitudinal axis.

A compact computing system includes a housing having a longitudinal axis and that encloses and defines an internal volume that is symmetric about the longitudinal axis, a heat sink that encloses at least a central thermal zone having a cross section having a shape of a polygon and that is substantially perpendicular to the longitudinal axis, an air mover configured to direct air through the internal volume and comprising a central airflow through the central thermal zone, and a computing component disposed within the internal volume and supported by and in thermal contact with the heat sink.

A consolidated thermal module (CTM) used to secure an integrated circuit (IC) to an electrical connector disposed on a first surface of a printed circuit board (PCB) and to maintain the IC in thermal contact with a heat transfer assembly includes a stiffener plate disposed on a second surface of the PCB, a retaining mechanism at least a portion of which is disposed on the stiffener plate configured to provide a first retaining force and a second retaining force, a first fastener used to secure the IC to the stiffener plate and the retaining mechanism, wherein the retaining mechanism evenly distributes the first retaining force across the stiffener plate that maintains the IC in uniform electrical contact with electrical contacts within the electrical connector, and a second fastener used to secure heat removal assembly to the retaining mechanism that maintains the IC in uniform thermal contact with the heat transfer assembly.

A thermal management system for a cylindrical desktop computer having a cylindrical housing that encloses a cylindrical volume having a longitudinal axis, the cylindrical housing having a first opening having a first cross section at a first end and a second opening having a second cross section at a second end opposite the first end includes a heat sink disposed within the cylindrical volume and comprising a plurality of planar faces that define and enclose a central thermal zone having a triangular cross section, and an air mover located near the second opening that moves air having no radial components at least through the central thermal zone.

A thermal module (TM) used to secure an integrated circuit (IC) to an electrical connector disposed on a first surface of a printed circuit board (PCB) and to maintain the IC in thermal contact with a heat transfer assembly includes a retaining mechanism configured to provide a first retaining force and a second retaining force, a first fastener used to secure the IC to the retaining mechanism, wherein the retaining mechanism evenly distributes the first retaining force across the IC that maintains the IC in uniform electrical contact with electrical contacts within the electrical connector, and a second fastener used to secure heat removal assembly to the retaining mechanism and that maintains the IC in uniform thermal contact with the heat transfer assembly.

A desktop computing system includes a housing that at least partially encloses and defines an internal volume that is symmetric about an axis, an air passage within the internal volume that extends along an entire length of the housing, and a computing engine disposed within the air passage and comprising at least one computing component.

Moreover, a thermal management system for a cylindrical desktop computer having a cylindrical housing that encloses a cylindrical volume having a longitudinal axis, the cylindrical housing having a first opening at a first end and a second opening at a second end opposite the first end. The thermal management system includes a heat sink disposed within the cylindrical volume and having a plurality of planar faces that define and enclose a central thermal zone having a triangular cross section.

The thermal management system includes cooling fin that extends from an interior surface of a first planar face to at least an interior surface of a second planar face and spans the central thermal zone. In an embodiment, the plurality of planar faces and an interior surface of the cylindrical housing enclose and define a peripheral thermal zone. In an embodiment, a center cooling fin extends from the interior surface of the first planar face to a junction of the interior surface of the second planar face and an interior surface of a third planar face. In an embodiment, the center cooling fin bisects the central thermal zone into a first region and a second region each having similar triangular cross sections. In an embodiment, the system also includes a first cooling fin that extends from the interior surface of the first planar face to only the interior surface of the second planar face and spans the first region. In an embodiment, the system also includes a second cooling fin that extends from the interior surface of the first planar face to only the interior surface of the third planar face and spans the second region.

In an embodiment, a first angle between the first cooling fin and the interior surface of first planar face varies in accordance with a distance between the first cooling fin and the center cooling fin. In an embodiment, a second angle between the interior surface of the second cooling fin and the interior surface of the first planar face varies in accordance with a distance between the second cooling fin and the center cooling fin. In an embodiment, a summation of the first angle and the second angle is equal to about 180°. In an embodiment, the heat sink is formed from a single piece of extruded metal. In an embodiment, the system also includes an air mover located near the second opening that creates a negative pressure differential in a first portion of the cylindrical housing that causes air to be drawn into the cylindrical housing at the first opening. In an embodiment, air is split into a central airflow that passes through the central thermal zone and a peripheral airflow that passes through the peripheral thermal zone. In an embodiment, the air mover is configured to recombine the central airflow and the peripheral airflow into an exhaust airflow.

In an embodiment, the air mover is configured to create a positive pressure differential in a second portion of the cylindrical housing that forces the exhaust airflow out of the cylindrical housing through the second opening. In an embodiment, one of the planar faces carries the computing component that is maintained within a range of predetermined operating temperatures by the thermal management system.

A thermal management system for removing heat from a computing engine having a computational component positioned within a cylindrical housing having a longitudinal housing is described. The thermal management system includes a heat sink having a plurality of planar faces defining a substantially triangular central airflow region. Each of the plurality of faces has an interior surface integrally formed with a plurality of cooling fins that extend from the interior surface and span the triangular central airflow region to an interior surface of another one of the plurality of faces, and an exterior surface configured to carry the computational component in thermal contact with the heat sink.

In an embodiment, the plurality of planar faces and an interior surface of the cylindrical housing enclose and define a peripheral airflow region. In an embodiment, the cylindrical housing further including a first opening at a first end and second opening at a second end opposite the first end. In an embodiment, the thermal management system further includes an air mover near the second opening configured to create a negative pressure differential within the cylindrical housing with respect to an external environment at the first opening. In an embodiment, the negative pressure differential at the first opening causes an intake of air into the first opening from the external environment. In an embodiment, the system also includes an air splitter near the first opening configured to split the intake air into a central airflow and a peripheral airflow. In an embodiment, the central airflow moves through the central airflow region along a central airflow path that is generally parallel to the longitudinal axis.

In an embodiment, the peripheral airflow moves through the peripheral airflow region along a peripheral airflow path that is generally parallel to the longitudinal axis. In an embodiment, where peripheral and central airflow have essentially no radial components. More specifically, the central airflow has no radial components as it passes through the central airflow region and the peripheral air flow has no radial components as it moves along the peripheral airflow path in that portion in which most of the heat generating components reside. In an embodiment, the air mover is configured to recombine the central airflow and the peripheral airflow into an exhaust airflow. In an embodiment, the air mover is configured to create a positive pressure differential within the cylindrical housing with respect to the external environment near the second opening. In an embodiment, the positive pressure differential forces the exhaust airflow through the second opening and out of the cylindrical housing where the exhaust airflow has a maximum acoustic signature of about 40 dBA and a maximum exhaust airflow at room temperature (25° C.) is about 25-30 cubic feet per minute (CFM) and about 40 CFM at an elevated temperature (35° C.).

In an embodiment, a first amount of heat from the computational component is transferred a vapor chamber in thermal contact with one of the plurality of cooling fins that is subsequently transferred to the central airflow. In an embodiment, a second amount of heat from the computational component is transferred directly to the peripheral airflow. In an embodiment, the opening in the second end of the cylindrical housing has an area greater than 50% of an overall cross-sectional area of the second end of the cylindrical housing. In an embodiment, the air mover is a mixed flow fan that produces essentially no radial airflow components.

A heat removal system for a computing device enclosed within a cylindrical housing is described. The heat removal system includes a plurality of vents configured to receive an intake airflow in accordance with a pressure differential across the plurality of vents and to direct the intake airflow towards a longitudinal axis of the cylindrical housing where the plurality of air vents is disposed at a first end of the cylindrical housing, a baffles arrangement disposed between the plurality of vents and the longitudinal axis of the cylindrical housing, the baffles arrangement configured to bifurcate the intake airflow into a central airflow and a peripheral airflow, the central airflow directed towards a central portion of the computing device and the peripheral airflow directed towards a peripheral portion of the computing device, and an air exhaust system disposed at a second end of the cylindrical housing opposite the first end, the air exhaust system configured to receive and combine the central airflow with the peripheral airflow, and to exhaust the combined airflow through an opening in the cylindrical housing. In one embodiment, the first end of the cylindrical housing includes a horizontal base that transitions to a curved portion, and where the plurality of vents are disposed along the curved portion of the cylindrical housing at an angle with respect to the horizontal base that directs the intake airflow towards the longitudinal axis of the cylindrical housing.

In one embodiment, an air mover disposed proximate the opening in the cylindrical housing defined by a circular lip portion having a tuned thickness arranged to evenly spread heat across the cylindrical housing. In one embodiment, the air exhaust system comprises a mixed flow fan configured to exhaust air out of the cylindrical housing. In one embodiment, the baffles arrangement comprises a data cable electrically coupling a first printed circuit board (PCB) to a second PCB. In one embodiment, a portion of the intake airflow that contacts the data cable is diverted towards the peripheral airflow. In one embodiment, a heat sink is configured to support at least two printed circuit boards, where an interior surface of the cylindrical housing cooperates with an outside surface of the heat sink to define a portion of the peripheral airflow. In one embodiment, the heat sink comprises a cooling fin stack that defines the central airflow. In one embodiment, the opening in the second end of the cylindrical housing has an area greater than 50% of an overall cross-sectional area of the second end of the cylindrical housing.

A method for removing heat from a desktop computer having a cylindrical housing having a first opening at a first end and a second opening axially disposed from the first opening at a second end is described. The method is carried out by drawing an intake airflow into the first opening of the cylindrical housing from the external environment by an air mover located near the second opening, where an airflow splitter near the first opening splits the airflow into a central airflow that follows a central airflow path through a central volume and a peripheral airflow that follows a peripheral airflow path through a peripheral volume separate from the central volume and combining the central airflow and the peripheral airflow into an exhaust airflow by the air mover that subsequently moves the exhaust airflow out from the cylindrical housing through the second opening and into the external environment.

A thermal management system for a cylindrical desktop computer is described. The thermal management system includes an air exhaust assembly suitable for cooling the cylindrical desktop computer, the air exhaust assembly has an impeller with a hub, a plurality of fan blades protruding radially from the hub, adjacent ones of the plurality of fan blades disposed about the hub at an irregular angular interval, and a support ring integrally formed along a bottom surface of a trailing edge portion of each of the plurality of fan blades, the support ring operative to provide at least structural support to the plurality of fan blades.

Also included is a plurality of stator blades and the impeller further includes a shaft axially stabilized by a thrust bearing. In one embodiment, the plurality of fan blades comprises backward swept fan blades. In one embodiment, a trailing edge of each of the plurality of fan blades is inclined about 10 degrees more than a corresponding leading edge of each of the plurality of fan blades. In one embodiment, the plurality of stator blades are curved stator blades, oriented in a direction opposite the plurality of fan blades. In one embodiment, air exhausted from the impeller has both axial and centrifugal components. In one embodiment, a geometry of the hub has a contoured geometry configured to contribute to an axial exhaust component of the airflow. In one embodiment, a plenum plate configured to direct air into the impeller. In one embodiment, the plurality of fan blades comprises 57 fan blades. In one embodiment, each fan blade is separated from an adjacent fan blade by a particular angular interval, where when each of the angular intervals is added together the angular intervals add up to 360 degrees, and where a first angular interval is 6.92°, a second angular interval is 6.2399°, a third angular interval is 6.1458°, a fourth angular interval is 5.7145°, a fifth angular interval is 5.9564°, a sixth angular interval is 5.7037°, a seventh angular interval is 5.7124°, an eighth angular interval is 5.8201°, a ninth angular interval 6.3916°, a tenth angular interval is 6.1342°, an eleventh angular interval is 6.2996°, a twelfth angular interval is 6.8305°, a thirteenth angular interval is 6.3928°, a fourteenth angular interval is 6.9324°, a fifteenth angular interval is 6.79°, a sixteenth angular interval is 6.3158°, a seventeenth angular interval is 6.6752°, an eighteenth angular interval is 6.332°, a nineteenth angular interval is 6.8873°, a twentieth angular interval is 6.9171°, a twenty-first angular interval is 6.529°, a twenty-second angular interval is 6.8115°, a twenty-third angular interval is 6.1026°, a twenty-fourth angular interval is 6.7456°; a twenty-fifth angular interval is 5.7116°, a twenty-sixth angular interval is 5.6961°, a twenty-seventh angular interval is 6.1673°; a twenty-eighth angular interval is 5.8777°; a twenty-ninth angular interval is 5.8416°, a thirtieth angular interval is 5.9396°, a thirty-first angular interval is 6.1763°, a thirty-second angular interval is 6.692°, a thirty-third angular interval is 5.8011°, a thirty-fourth angular interval is 6.4961°, a thirty-fifth angular interval is 6.4858°, a thirty-sixth angular interval is 6.305°, a thirty-seventh angular interval is 5.886°, a thirty-eight angular interval is 5.6992°, a thirty-ninth angular interval is 6.1355°, a fortieth angular interval is 6.9192°, a forty-first angular interval is 6.4834°, a forty-second angular interval is 6.3266°, a forty-third angular interval is 6.395°, a forty-fourth angular interval is 6.2282°, a forty-fifth angular interval is 6.4552°, a forty-sixth angular interval is 6.9279°, a forty-seventh angular interval is 6.7538°, a forty-eighth angular interval is 6.9354°, a forty-ninth angular interval is 6.926°, a fiftieth angular interval is 6.4034°, a fifty-first angular interval is 6.1482°, a fifty-second angular interval is 6.4643°, a fifty-third angular interval is 5.7442°, a fifty-fourth angular interval is 5.7055°, a fifty-fifth angular interval is 6.4974°, a fifty-sixth angular interval is 6.2366°, and a fifty-seventh angular interval is 6.2388°.

A thermal management system for use in a cylindrical desktop computer is described. The thermal management system includes a flow fan an impeller includes a plurality of fan blades configured to exhaust air having both axial and centrifugal components and an air exhaust grill surrounding the impeller and defining a plurality of air vents through which the exhaust air exits the mixed flow fan. In the described embodiment, the plurality of air exhaust vents includes a plurality of ribs configured to cooperate with the plurality of fan blades to impart an increased axial component to the air exhausted from the impeller, and a plurality of stators configured to straighten the air exiting the impeller by substantially removing a tangential component of the air passing through the air exhaust grill.

In one embodiment, each stator of the plurality of stators has a curved geometry configured to gradually remove the tangential component from the exhaust air such that turbulent flow is substantially avoided. In one embodiment, a curvature of the plurality of fan blades is opposite a curvature of the plurality of stators. In one embodiment, a plenum plate disposed across an inlet portion of the impeller, the plenum plate configured to both direct air into a central portion of the impeller and to function as a shroud to direct air passing through a lower portion of the impeller towards the air exhaust grill. In one embodiment, the impeller further comprises a band coupled to a peripheral portion of the impeller, the band configured to provide structural support to the plurality of blades and to add an additional axial component to a portion of the air it comes in contact with.

In one embodiment, a thrust bearing is configured to stabilize the impeller. In one embodiment, the impeller further includes a contoured portion configured to impart an axial component to the air prior to the air being engaged by the fan blades.

A heat sink for removing heat from a computing engine that includes a computing component disposed within a cylindrical volume having a longitudinal axis. The heat sink includes at least a plurality of planar faces that enclose and define a central thermal zone having a triangular cross section that is substantially parallel to the longitudinal axis. In one embodiment, one of the planar faces carries the computing component. In one embodiment, the computing engine has a form factor corresponding to the heat sink. In one embodiment, the heat sink comprises a cooling fin that extends along an inside surface of a first planar face. In one embodiment, the cooling fin extends from the inside surface of the first planar face to at least an inside surface of a second planar face and spans the central thermal zone.

In one embodiment, a center cooling fin extends from the inside surface of the first planar face to a junction of the inside surface of the second planar face and an inside surface of a third planar face. In one embodiment, the center cooling fin bisects the central thermal zone into a first region and a second region each having similar triangular cross sections. In one embodiment, a first cooling fin that extends from the inside surface of the first planar face to the inside surface of the second planar face and spans the first region. In one embodiment, a second cooling fin that extends from the inside surface of the first planar face to the inside surface of the third planar face and spans the second region. In one embodiment, a first angle between the first cooling fin and the inside surface of first planar face varies in accordance with a distance between the first cooling fin and the center cooling fin. In one embodiment, a second angle between the inside surface of the second cooling fin and the inside surface of the first planar face varies in accordance with a distance between the second cooling fin and the center cooling fin. In one embodiment, a summation of the first angle and the second angle is equal to about 180°.

A compact computing system includes a cylindrical housing that encloses and defines a cylindrical volume having a longitudinal axis, a heat sink that encloses at least a central thermal zone that is substantially parallel to the longitudinal axis and a computing component disposed within the cylindrical volume and supported by and in thermal contact with the heat sink. In one embodiment, the cylindrical housing comprises a first opening at a first end of the cylindrical housing having a first diameter corresponding to a diameter of the cylindrical housing and a top opening at a second end opposite the first end having a second diameter. The system also includes a base unit at the first end of the cylindrical housing that fits the first opening of the cylindrical housing and includes a support element that provides support for the compact computing system and a vent that enables passage of the intake airflow in cooperation with the air mover where the air mover is near the top opening. In an embodiment, the air mover merges the central airflow and the peripheral airflow and the air mover moves the merged airflow through the top opening and out of the cylindrical housing. In an embodiment, the second diameter is less than the first diameter.

A desktop computing system includes a housing having an axisymmetric shape and a length and an air passage that extends the length of the housing. In one embodiment, a computing engine is disposed within air passage. In one embodiment, a structural core is positioned within the housing that provides structural support for the computing engine such that the computing engine takes on a general shape of the structural core. In one embodiment, the structural core includes a heat sink that facilitates removal of heat from the computing engine. In one embodiment, the heat sink passes the at least some of the heat removed from the computing engine to the air passage. In one embodiment, the housing is a cylindrical housing. In one embodiment, the air passage is a cylindrical air passage. In one embodiment, the structural core has a triangular shape. In one embodiment, the desktop computing system includes an air mover configured to move air through the length of the air passage.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data that can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. It is therefore intended that the following appended claims be interpreted as including all such alterations, permutations, and equivalents as fall within the true spirit and scope of the described embodiments.

What is claimed is:

1. A thermal management system for a desktop computer having a housing, with a longitudinal axis, that encloses an internal volume and that is symmetric about the longitudinal axis, comprising:
    a heat sink disposed within the internal volume and comprising a plurality of planar faces that define and completely enclose a central thermal zone having a polygonal cross section that is perpendicular to the longitudinal axis; and
    an air mover that moves air through at least the central thermal zone.

2. The thermal management system as recited in claim 1, further comprising a computational component mounted on at least one of the plurality of planar faces and in thermal contact with the heat sink.

3. The thermal management system as recited in claim 2, where the plurality of planar faces and an interior surface of the housing encloses and defines a peripheral thermal zone.

4. The thermal management system as recited in claim 3, wherein the plurality of planar faces comprises a first planar face, a second planar face, and a third planar face.

5. The thermal management system as recited in claim 4, the heat sink further comprising:
    a center cooling fin that extends from the interior surface of the first planar face to a junction of the interior surface of the second planar face and an interior surface of the third planar face, wherein the center cooling fin bisects the central thermal zone into a first region and a second region each having similar cross sections.

6. The thermal management system as recited in claim 5, the heat sink further comprising:
    a first cooling fin that extends directly from the interior surface of the first planar face to the interior surface of the second planar face and that spans the first region, and
    a second cooling fin that extends directly from the interior surface of the first planar face to the interior surface of the third planar face and that spans the second region.

7. The thermal management system as recited in claim 6, wherein a first angle between the first cooling fin and the interior surface of the first planar face varies in accordance with a distance between the first cooling fin and the center cooling fin.

8. The thermal management system as recited in claim 7, wherein a second angle between the interior surface of the second cooling fin and the interior surface of the first planar face varies in accordance with a distance between the second cooling fin and the center cooling fin, wherein a summation of the first angle and the second angle is equal to about 180°.

9. The thermal management system as recited in claim 8, wherein the air mover creates a negative pressure differential in a first portion of the internal volume that pulls air into the internal volume at a first opening at a first end of the housing.

10. The thermal management system as recited in claim 9, further comprising an air splitter in proximity to the first opening that splits the air pulled into the first opening into a central airflow that is pulled through the central thermal zone and a peripheral airflow that is pulled through the peripheral thermal zone, the central airflow and the peripheral airflow being separate from each other.

11. The thermal management system as recited in claim 10, wherein the air mover combines the central airflow and the peripheral airflow into an exhaust airflow.

12. The thermal management system as recited in claim 11, wherein the air mover pushes the exhaust airflow out of the internal volume through a second opening opposite the first opening.

13. A thermal management system for removing heat from a desktop computer that includes a housing having a longitudinal axis and that at least partially defines and encloses an internal volume that is symmetric about the longitudinal axis, comprising:
    a heat sink positioned within the internal volume, comprising:
    a plurality of planar faces that define a central airflow region having a cross section in a shape of a polygon that is perpendicular to the longitudinal axis, at least one of the plurality of planar faces comprising:
        an interior surface integrally formed with a cooling fin that extends from the interior surface and spans the central airflow region to an interior surface of at least another one of the plurality of planar faces, and
        an exterior surface configured to carry a computational component in thermal contact with the heat sink.

14. The thermal management system as recited in claim 13, wherein the plurality of planar faces and an interior surface of the housing enclose and define a peripheral airflow region.

15. The thermal management system as recited in claim 14, the housing further comprising a first opening at a first end and second opening at a second end opposite the first end.

16. The thermal management system as recited in claim 15, further comprising an air mover near the second opening configured to pull air from an external environment and into the internal volume through the first opening.

17. The thermal management system as recited in claim 16, wherein an air splitter near the first opening splits the air pulled through the first opening into a central airflow that is pulled through the central airflow region along a central airflow path that is generally parallel to the longitudinal axis and a peripheral airflow that is pulled through the peripheral airflow region along a peripheral airflow path that is generally parallel to the longitudinal axis and separate from the central airflow path.

18. The thermal management system as recited in claim 17, wherein the air mover recombines the central airflow and the peripheral airflow into an exhaust airflow that is pushed out through the second opening and having essentially no tangential components.

19. The thermal management system as recited in claim 13, wherein the housing has a cylindrical shape, and wherein the polygon is a triangle.

20. A heat removal system for a computing device enclosed within a cylindrical housing, the heat removal system comprising:
- a plurality of vents configured to receive an intake airflow in accordance with a pressure differential across the plurality of vents and to direct the intake airflow along a longitudinal axis of the cylindrical housing, wherein the plurality of air vents is disposed at a first end of the cylindrical housing;
- a baffles arrangement disposed between the plurality of vents and the longitudinal axis of the cylindrical housing, the baffles arrangement configured to bifurcate the intake airflow into a central airflow and a peripheral airflow, the central airflow directed towards a central portion of the computing device and the peripheral airflow directed towards a peripheral portion of the computing device; and
- an air exhaust system disposed at a second end of the cylindrical housing opposite the first end, the air exhaust system configured to receive and combine the central airflow with the peripheral airflow, and to exhaust the combined airflow through an opening in the cylindrical housing at the second end.

21. The heat removal system as recited in claim 20, the first end of the cylindrical housing comprising a base comprising a pedestal that transitions to a curved portion, and wherein the plurality of vents are disposed along a circumference of the curved portion of the base at an angle with respect to the cylindrical housing that directs the intake airflow towards the longitudinal axis of the cylindrical housing.

22. The heat removal system as recited in claim 21, the air exhaust system comprising an air mover disposed proximate the opening in the cylindrical housing.

23. The heat removal system as recited in claim 22, wherein the baffles arrangement comprises a data cable electrically coupling a first printed circuit board (PCB) to a second PCB.

24. The heat removal system as recited in claim 23, further comprising:
- a heat sink having a triangular cross section that is generally parallel to the longitudinal axis and configured to structurally support a computational component.

25. The heat removal system as recited in claim 24, wherein the heat sink comprises a cooling fin stack through which the central airflow passes and which carries away at least some of the heat generated by the computational component.

26. A thermal management system for a cylindrical desktop computer having a cylindrical housing that encloses a cylindrical volume having a longitudinal axis, the cylindrical housing having a first opening having a first cross section at a first end and a second opening having a second cross section at a second end opposite the first end, comprising:
- a heat sink disposed within the cylindrical volume and comprising a plurality of planar faces that define and enclose a central thermal zone having a triangular cross section; and
- an air mover located near the second opening that moves air at least through the central thermal zone.

27. The thermal management system as recited in claim 26, the heat sink comprising a fin stack that spans the central thermal zone and is generally parallel to the longitudinal axis.

28. The thermal management system as recited in claim 27, wherein the air mover pulls an amount of air into the cylindrical housing at the first opening.

29. The thermal management system as recited in claim 28, further comprising an air splitter that splits the amount of air pulled into the cylindrical housing into a central airflow that passes through the central thermal zone and a peripheral airflow that passes through a peripheral thermal zone separate from the central thermal zone.

30. The thermal management system as recited in claim 28, wherein the fin stack eliminates a radial component from the central airflow as the central airflow passes through the central thermal zone.

31. A method for removing heat generated by a computational component disposed within an air passage enclosed and defined by a cylindrical housing having a longitudinal axis and having a first opening at a first end of the longitudinal axis and a second opening at a second end of the longitudinal axis aligned with and opposite the first end, the method comprising:
- pulling an intake airflow into the air passage through an air intake at the first opening by an air mover located near the second opening;
- splitting the intake airflow by an air splitter located between the longitudinal axis and the air intake into a central airflow that passes through a central portion of the air passage and a peripheral airflow that concurrently passes through a peripheral portion of the air passage separate from the central portion of the air passage, wherein the computational component transfers at least some heat to the central airflow and the peripheral airflow;
- combining the central airflow and the peripheral airflow into an exhaust airflow by the air mover; and
- pushing the exhaust airflow out of the housing through the second opening.

32. The method as recited in claim 31, wherein the central airflow is pulled through
a heat sink positioned within the central portion of the air passage such that the central airflow has essentially no radial components.

33. The method as recited in claim 31, wherein the air mover eliminates substantially all tangential components from the exhaust airflow.

* * * * *